United States Patent
Hirota et al.

(10) Patent No.: US 11,605,665 B2
(45) Date of Patent: Mar. 14, 2023

(54) SEMICONDUCTOR APPARATUS AND METHOD FOR PRODUCING SEMICONDUCTOR APPARATUS

(71) Applicant: CANON KABUSHIKI KAISHA, Tokyo (JP)

(72) Inventors: Katsunori Hirota, Kanagawa (JP); Tsutomu Tange, Kanagawa (JP); Takuya Hara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 206 days.

(21) Appl. No.: 17/076,678

(22) Filed: Oct. 21, 2020

(65) Prior Publication Data

US 2021/0126026 A1 Apr. 29, 2021

(30) Foreign Application Priority Data

Oct. 25, 2019 (JP) .............................. JP2019-194803
Aug. 5, 2020 (JP) .............................. JP2020-132817

(51) Int. Cl.
*H01L 27/146* (2006.01)

(52) U.S. Cl.
CPC ...... *H01L 27/1464* (2013.01); *H01L 27/1469* (2013.01); *H01L 27/14634* (2013.01); *H01L 27/14636* (2013.01); *H01L 27/14627* (2013.01); *H01L 27/14632* (2013.01); *H01L 27/14687* (2013.01)

(58) Field of Classification Search
CPC ...................... H01L 27/1464; H01L 27/14601
See application file for complete search history.

(56) References Cited

U.S. PATENT DOCUMENTS

| 5,122,669 | A | * | 6/1992 | Herring | H01L 27/1464 257/466 |
| 7,759,707 | B2 | * | 7/2010 | Uya | H01L 27/14601 257/797 |
| 2009/0090937 | A1 | * | 4/2009 | Park | H01L 27/1464 257/E31.001 |
| 2011/0241148 | A1 | | 10/2011 | Hiyama et al. | |
| 2011/0291219 | A1 | * | 12/2011 | Kwon | H01L 27/1463 257/447 |
| 2013/0320477 | A1 | | 12/2013 | Ohmi et al. | |
| 2016/0035766 | A1 | | 2/2016 | Hongo et al. | |
| 2016/0035786 | A1 | | 2/2016 | Matsumra | |
| 2019/0157319 | A1 | * | 5/2019 | Chiang | H01L 27/1461 |
| 2019/0157323 | A1 | * | 5/2019 | Ogi | H01L 27/14685 |

FOREIGN PATENT DOCUMENTS

| JP | 2007088450 A | 4/2007 |
| JP | 2011119620 A | 6/2011 |
| JP | 2011205141 A | 10/2011 |
| JP | 2014053431 A | 3/2014 |
| JP | 2014179655 A | 9/2014 |

* cited by examiner

*Primary Examiner* — David A Zarneke
(74) *Attorney, Agent, or Firm* — Canon U.S.A., Inc., IP Division

(57) ABSTRACT

A semiconductor apparatus includes a semiconductor layer that includes a photoelectric conversion unit disposed between a front surface and a back surface and a transistor disposed at the front surface, and a dielectric film in contact with the back surface, wherein the semiconductor layer includes a region extending 100 nm from the back surface, the region having boron concentrations whose maximum value is more than $1\times10^{20}$ [atoms/cm$^3$].

7 Claims, 15 Drawing Sheets

SEMICONDUCTOR APPARATUS AND METHOD FOR PRODUCING SEMICONDUCTOR APPARATUS

BACKGROUND OF THE INVENTION

Field of the Invention

The present disclosure relates to a semiconductor apparatus.

Description of the Related Art

In general, during the production of the backside illumination semiconductor apparatus, a semiconductor layer is thinned to form a semiconductor layer.

Japanese Patent Laid-Open No. 2011-119620 discloses that, after a first removal step, a second removal step is performed such that the substrate is further thinned from the second surface-side at a processing speed lower than that in the first removal step, and the second removal step ends by exposing a first impurity region.

Japanese Patent Laid-Open No. 2011-205141 discloses that the back surface region is removed by physical polishing, wet etching, and CMP.

In the techniques of Japanese Patent Laid-Open No. 2011-119620 and Japanese Patent Laid-Open No. 2011-205141, the structure at and near the back surface of the semiconductor layer during the thinning step and after the thinning step is not sufficiently studied, and there is room for improvement in properties of such semiconductor apparatuses.

SUMMARY OF THE INVENTION

Thus, the present disclosure provides an effective technique for improving properties of the semiconductor apparatuses.

A first aspect provides a semiconductor apparatus including a semiconductor layer that includes a front surface, a back surface, a photoelectric conversion unit disposed between the front surface and the back surface, and a transistor disposed at the front surface, and that is mainly formed of silicon; and a dielectric film in contact with the back surface, wherein the semiconductor layer includes a region extending 100 nm from the back surface, the region having boron concentrations whose maximum value is more than $1 \times 10^{20}$ [atoms/cm$^3$].

A second aspect provides a method for producing a semiconductor apparatus, the method including a step of preparing a semiconductor layer including a front surface at which a transistor is disposed, an opposite surface on a side opposite from the front surface, and a photoelectric conversion unit disposed between the front surface and the opposite surface; and a step of thinning the semiconductor layer from a side of the opposite surface by removing a portion of the semiconductor layer, wherein the semiconductor layer includes a portion containing carbon, and, in the step of thinning the semiconductor layer, the portion is removed by wet etching.

A third aspect provides a method for producing a semiconductor apparatus, the method including a step of preparing a semiconductor layer including a front surface at which a transistor is disposed, an opposite surface on a side opposite from the front surface, and a photoelectric conversion unit disposed between the front surface and the opposite surface; and a step of thinning the semiconductor layer from a side of the opposite surface by removing a portion of the semiconductor layer, wherein the step of thinning the semiconductor layer includes mechanical grinding for the semiconductor layer, wet etching for the semiconductor layer performed after the mechanical grinding, and chemical mechanical polishing for the semiconductor layer performed after the wet etching, and an amount of the semiconductor layer removed by the wet etching is larger than an amount of the semiconductor layer removed by the chemical mechanical polishing.

A fourth aspect provides a method for producing a semiconductor apparatus, the method including a step of preparing a semiconductor layer that includes a front surface at which a transistor is disposed, an opposite surface on a side opposite from the front surface, and a photoelectric conversion unit disposed between the front surface and the opposite surface, and that is mainly formed of silicon; and a step of thinning the semiconductor layer from a side of the opposite surface, wherein the semiconductor layer includes an impurity region disposed between the front surface and the opposite surface and having boron concentrations whose maximum value is more than $1 \times 10^{20}$ [atoms/cm$^3$], and the step of thinning the semiconductor layer is performed such that, after the thinning, a region of the semiconductor layer, the region extending 100 nm from the opposite surface on the side opposite from the front surface, has boron concentrations whose maximum value is more than $1 \times 10^{20}$ [atoms/cm$^3$].

Further features of the present disclosure will become apparent from the following description of exemplary embodiments with reference to the attached drawings.

DESCRIPTION OF THE EMBODIMENTS

Hereinafter, embodiments of the present disclosure will be described with reference to drawings. Incidentally, in the following descriptions and drawings, a plurality of drawings share reference signs for components included in common. Thus, such common components will be described with reference to such a plurality of drawings, and then explanations of these components denoted by common reference signs will be appropriately omitted. Specific embodiments and Examples of a semiconductor apparatus according to the present disclosure will be described with reference to the attached drawings.

First Embodiment

Figure 1A:
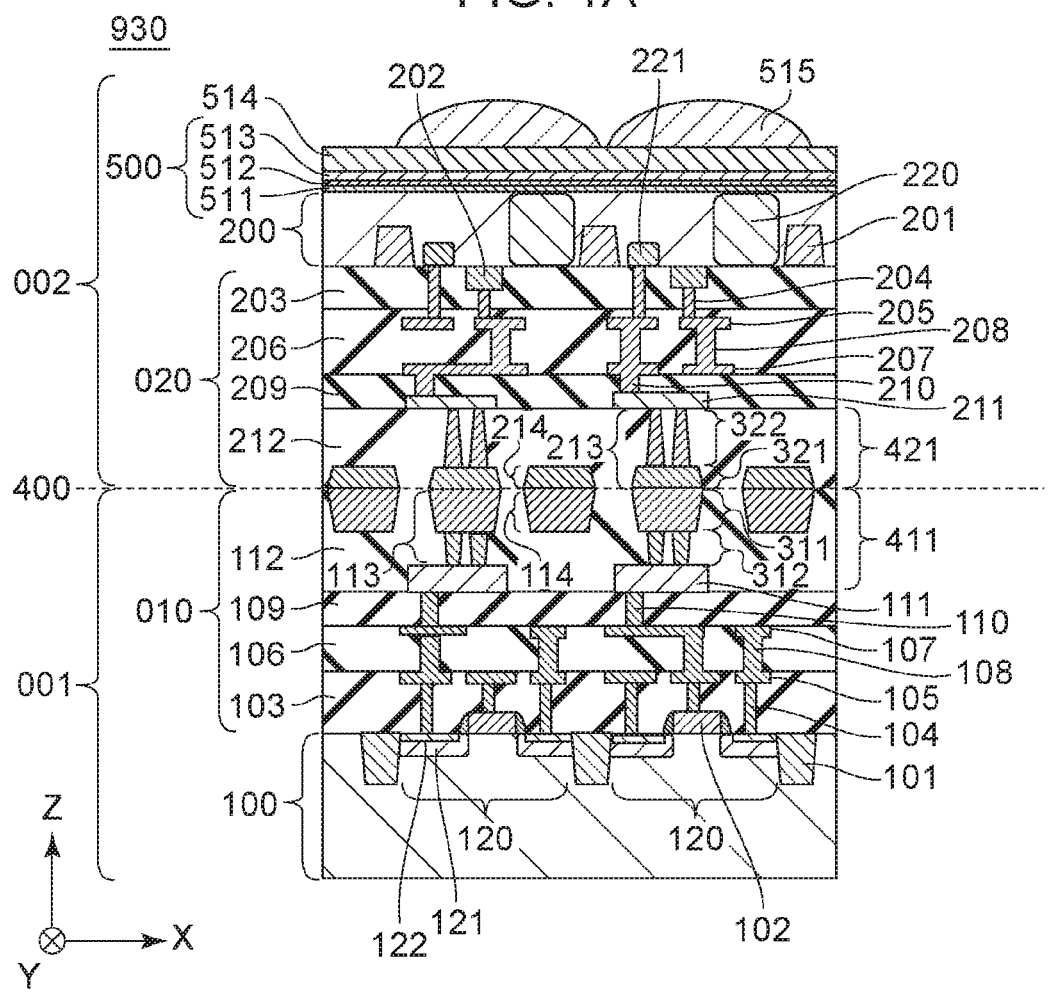
FIGS. 1A and 1B are schematic views of a semiconductor apparatus.

FIG. 1A is a schematic sectional view of a semiconductor apparatus 930. The semiconductor apparatus 930 includes a semiconductor part 001 including a semiconductor layer 100 and an insulating film 112 on the semiconductor layer 100, and a semiconductor part 002 including a semiconductor layer 200 and an insulating film 212 on the semiconductor layer 200. In this embodiment, the semiconductor layer 200 has a thickness of, for example, about 3 to about 5 μm. The semiconductor layers 100 and 200 are each a semiconductor layer mainly formed of silicon, but may be alternatively a semiconductor layer including a component other than silicon as a main component. Incidentally, the phrase "mainly formed of X" used herein means that, of the elements contained in the layer, an element of the highest content except for oxygen is X. The semiconductor layer formed of silicon includes, in addition to silicon, an impurity (dopant) for forming a p type or n type semiconductor region. The semiconductor layer may further include, for example, oxygen for increasing the strength of the semiconductor layer, hydrogen for the ends of dangling bonds, and inevitable impurities (such as metallic elements).

The semiconductor part 001 and the semiconductor part 002 are disposed on top of each other, and bonded together at a bonding interface 400. The semiconductor layer 100 and the semiconductor layer 200 are laminated such that, in a lamination direction Z, the insulating film 112 and the insulating film 212 are positioned between the semiconductor layer 100 and the semiconductor layer 200. A plurality of conductor sections 113 are individually disposed in a plurality of recesses formed in the insulating film 112. A plurality of conductor sections 213 are individually disposed in a plurality of recesses formed in the insulating film 212. The semiconductor part 001 and the semiconductor part 002 are bonded together using the conductor sections 113 disposed in the recesses formed in the insulating film 112 and the conductor sections 213 disposed in the recesses formed in the insulating film 212.

A plane perpendicular to the lamination direction Z is defined as an X-Y plane. The X-Y plane extends parallel to the main surface of the semiconductor layer 100 and/or the main surface of the semiconductor layer 200. The direction X and the direction Y are orthogonal to each other, and are parallel to the main surface of the semiconductor layer 100 and/or the main surface of the semiconductor layer 200. The sectional view of the semiconductor apparatus 930 in FIG. 1A is taken in a direction (Z-axis direction) in which the semiconductor layer 100 and the semiconductor layer 200 are laminated.

The conductor sections 113 are each constituted by a pad 311 surrounded by the insulating film 112 in the X-Y plane, and vias 312 connected to the pad 311 so as to be positioned, in the lamination direction Z, between the pad 311 and the semiconductor layer 100. Each via 312 is connected to a conductor layer 111 positioned, in the lamination direction Z, between the via 312 and the semiconductor layer 100. The conductor layer 111 is positioned closer to the via 312.

The conductor sections 213 are each constituted by a pad 321 surrounded by the insulating film 212 in the X-Y plane, and vias 322 connected to the pad 321 so as to be positioned, in the lamination direction Z, between the pad 321 and the semiconductor layer 200. Each via 322 is connected to a conductor layer 211 positioned, in the lamination direction Z, between the via 322 and the semiconductor layer 200. The conductor layer 211 is positioned closer to the via 322.

The semiconductor apparatus 930 includes a wiring structure 010 and a wiring structure 020 disposed between the semiconductor layer 100 and the semiconductor layer 200. The semiconductor part 001 is a semiconductor part (semiconductor chip) including the semiconductor layer 100 and the wiring structure 010. The semiconductor part 002 is a semiconductor part (semiconductor chip) including the semiconductor layer 200 and the wiring structure 020. As described later, the wiring structure 010 and the wiring structure 020 each include a plurality of wiring layers stacked and a plurality of insulating films stacked. Thus, the structure in which the wiring structure 010 and the wiring structure 020 are bonded together can be referred to as a wiring structure section of the semiconductor apparatus 930. The semiconductor apparatus 930 is provided by bonding together the semiconductor part 001 and the semiconductor part 002.

The structure disposed between the semiconductor layer 100 and the semiconductor part 002 (between the semiconductor layer 100 and the wiring structure 020) is the wiring structure 010. The wiring structure 010 includes the conductor sections 113 and the conductor layer 111 described above. The wiring structure 010 may include, in addition to the conductor sections 113 and the conductor layer 111, a via plug 110, a wiring layer 107, a via plug 108, a wiring layer 105, and a contact plug 104 disposed between the conductor layer 111 and the semiconductor layer 100. The wiring structure 010 includes the above-described insulating film 112, and may include, in addition to the insulating film 112, interlayer insulating films 109, 106, and 103 disposed between the insulating film 112 and the semiconductor layer 100.

The structure disposed between the semiconductor layer 200 and the semiconductor part 001 (between the semiconductor layer 200 and the wiring structure 010) is the wiring structure 020. The wiring structure 020 includes the conductor sections 213 and the conductor layer 211 described above. The wiring structure 020 may include, in addition to the conductor sections 213 and the conductor layer 211, a via plug 210, a wiring layer 207, a via plug 208, a wiring layer 205, and a contact plug 204 disposed between the conductor layer 211 and the semiconductor layer 200. The wiring structure 020 includes the above-described insulating film 212, and may include, in addition to the insulating film 212, interlayer insulating films 209, 206, and 203 disposed between the insulating film 212 and the semiconductor layer 200. The conductor layers 111 and 211, which may be referred to as wiring layers, are herein referred to as conductor layers 111 and 211 in order to distinguish the wiring layers disposed close to the vias 312 and 322 from the other wiring layers. The via plug 208 connects the wiring layer 205 and the wiring layer 207 to each other. The via plug 210 connects the wiring layer 207 and the conductor layer 211 to each other. The conductor sections 213 are embedded in recesses formed in the insulating film 212, which is a damascene structure. At least a portion of such a conductor section 213 is connected to the conductor layer 211. In this embodiment, the conductor sections 213 have a dual damascene structure, and are each constituted by the pad 321 and the via 322. The semiconductor part 001 and the semiconductor part 002 are electrically interconnected via the conductor sections 113 and the conductor sections 213.

Incidentally, the main component of the conductor sections 113 and 213 can be copper; however, the main component of the conductor sections 113 and 213 is not limited to copper, and may be gold or silver. The main component of the insulating films 112 and 212 can be a silicon compound. The insulating films 112 and 212 may have a multilayer structure formed of a plurality of materials, such as a film structure in which a layer for preventing diffusion of metal (such as a silicon nitride layer), a silicon oxide layer, and a low-k material layer are stacked. This prevents the effect of diffusion of metal due to bonding displacement between the conductor sections 113 and 213 resulted from misalignment during bonding together of the semiconductor part 001 and the semiconductor part 002. Incidentally, the main component of the insulating films 112 and 212 may be resin.

The conductor sections 113 and the insulating film 112 are collectively referred to as a bonding member 411. The conductor sections 213 and the insulating film 212 are collectively referred to as a bonding member 421. The bonding member 411 included in the semiconductor part 001 and the bonding member 421 included in the semiconductor part 002 are bonded together. From the semiconductor layer 100 to the semiconductor layer 200, the contact plug 104, the wiring layers 105 and 107, the conductor layer 111, the conductor sections 113 and 213, the conductor layer 211, the wiring layers 207 and 205, and the contact plug 204 are electrically interconnected. These constitute wiring (interlayer wiring) between the semiconductor layer 100 and the semiconductor layer 200. In the interlayer wiring, one end may be connected to the gate electrode, and the other end may be connected to the source/drain; alternatively, the one end and the other end of the interlayer wiring may be connected to the source/drain.

In the semiconductor apparatus 930, the wiring structure 010 and the wiring structure 020 are bonded together. More specifically, the wiring structure 010 and the wiring structure 020 are bonded together at the bonding interface 400 constituted by the bonding member 411 of the wiring structure 010 and the bonding member 421 of the wiring structure 020. Incidentally, the bonding interface 400 includes the front surface of the bonding member 411 and the front surface of the bonding member 421.

The semiconductor layer 100 includes an element isolation section 101 and a plurality of transistors 120. Of the plurality of surfaces of the semiconductor layer 100, a surface at which the plurality of transistors 120 are disposed is the main surface of the semiconductor layer 100. The main surface may also be referred to as a front surface. A surface opposite to the main surface may be referred to as a back surface. Incidentally, in the semiconductor apparatus 930 serving as a photoelectric conversion apparatus, the integrated circuit of the semiconductor layer 100 may include a signal-processing circuit for processing pixel signals, such as an analog signal-processing circuit, an AD conversion circuit, a noise reduction circuit, or a digital signal-processing circuit. The semiconductor layer 100 may be referred to as a "substrate" or a "semiconductor layer".

The element isolation section 101 has an STI (Shallow Trench Isolation) structure and defines the element region (active region) of the semiconductor layer 100. The plurality of transistors 120 can constitute a CMOS circuit. The source/drain 121 of such a transistor 120 may include a silicide layer 122 such as a cobalt silicide layer or a nickel silicide layer. The gate electrode 102 of the transistor 120 may include a silicide layer, a metal layer, or a metal compound layer. The gate insulating film of the transistor 120 may be a silicon oxide film, a silicon nitride film, or a metal oxide film.

The semiconductor layer 200 includes an element isolation section 201, a gate electrode 202, a photoelectric conversion unit 220, and a source/drain 221. The photoelectric conversion unit 220 is constituted by a photodiode or a photogate. The photodiode may be an avalanche diode. Of the surfaces of the semiconductor layer 200, a surface at which a plurality of transistors are disposed is the main surface of the semiconductor layer 200. The main surface may also be referred to as a front surface. A surface opposite to the main surface may be referred to as a back surface. The semiconductor layer 200 may be referred to as a "substrate" or a "semiconductor layer".

Incidentally, in the following description, of the P type semiconductor regions, an impurity region that has a relatively low net impurity concentration (such as a boron concentration) is referred to as a P− type impurity region; an impurity region that has a relatively high net impurity concentration (such as a boron concentration) is referred to as a P+ type impurity region. The P+ type impurity region has a net impurity concentration (such as a boron concentration) of, for example, $4 \times 10^{18}$ [atoms/cm$^3$] or more. Of such P+ type impurity regions, an impurity region that has a net impurity concentration of more than $1 \times 10^{20}$ [atoms/cm$^3$] is referred to as a P++ type impurity region. The P− type impurity region has a net impurity concentration of, for example, $2 \times 10^{15}$ [atoms/cm$^3$] or less. The P type semiconductor region can include a P type impurity region that has an impurity concentration of more than $2 \times 10^{15}$ [atoms/cm$^3$] and less than $4 \times 10^{18}$ [atoms/cm$^3$]. Incidentally, the P type semiconductor region is a general name including the P+ type impurity region and the P− type impurity region.

In the following description, of the N type semiconductor regions, an impurity region that has a relatively low net impurity concentration (such as an arsenic concentration or a phosphorus concentration) is referred to as an N− type impurity region; an impurity region that has a relatively high net impurity concentration (such as an arsenic concentration or a phosphorus concentration) is referred to as an N+ type impurity region. The N+ type impurity region has a net impurity concentration (such as an arsenic concentration or a phosphorus concentration) of, for example, $1 \times 10^{18}$ [atoms/cm$^3$] or more. The N− type impurity region has a net impurity concentration of, for example, $6 \times 10^{14}$ [atoms/cm$^3$] or less. The N type semiconductor region can include an impurity region that has an impurity concentration of more than $6 \times 10^{14}$ [atoms/cm$^3$] and less than $1 \times 10^{18}$ [atoms/cm$^3$]. Incidentally, the N type semiconductor region is a general name including the N+ type impurity region and the N− type impurity region.

The element isolation section 201 has an STI structure and defines the element region (active region) of the semiconductor layer 200. The gate electrode 202 transfers electric charges of the photoelectric conversion unit 220 to a floating diffusion. The semiconductor layer 200 includes a pixel circuit that converts the electric charges generated in the photoelectric conversion unit 220 into pixel signals. The pixel circuit can include pixel transistors such as a reset transistor, an amplification transistor, and a selection transistor. Pixel signals corresponding to the electric charges transferred to the floating diffusion are generated by the amplification transistor. The potential of the floating diffusion is reset by the reset transistor to a reset potential.

Each conductor section 113 is electrically connected via a silicide layer 122, which is a cobalt silicide layer or a nickel silicide layer, to the semiconductor layer 100. In this embodiment, the contact plug 104 connected to the conductor section 113 is formed by a salicide process so as to be in contact with the silicide layer 122 extending between the interlayer insulating film 103 and the semiconductor layer 100. On the other hand, each conductor section 213 is electrically connected to the semiconductor layer 200 not via a silicide layer that is a cobalt silicide layer or a nickel silicide layer. In this embodiment, the contact plug 204 connected to the conductor section 213 is in contact (ohmic contact) with the impurity region of the semiconductor layer 100 formed not by a salicide process. Alternatively, the conductor section 213 may be electrically connected, via a silicide layer locally formed under the contact plug 204 and formed of titanium silicide or tungsten silicide, to the semiconductor layer 200. In the case where the conductor section 113 is connected, via the silicide layer 122, to the semiconductor layer 100, a low contact resistance can be achieved, compared with a case where the conductor section 213 is connected to the semiconductor layer 200 not via a silicide layer or via a silicide layer locally formed.

In this embodiment, the semiconductor part 001 includes a digital circuit while the semiconductor part 002 includes an analog circuit; alternatively, the semiconductor part 001 may include an analog circuit while the semiconductor part 002 includes a digital circuit. In this embodiment, the semiconductor layer 200 includes a photoelectric conversion unit. The photoelectric conversion unit in the semiconductor layer 200 is connected to a floating diffusion via a transfer gate. The floating diffusion is connected to the gate of a source follower transistor. From the source of the source follower transistor, analog pixel signals are outputted. A pixel circuit including a transfer gate and a source follower transistor can be an analog circuit of the semiconductor part 002. Analog pixel signals are subjected to AD conversion by an AD conversion circuit into digital pixel signals. The digital pixel signals are subjected to signal-processing by a digital signal processor (DSP). The digital signal processor that performs image processing can be an image signal processor (ISP). This digital signal processor can be a digital circuit of the semiconductor part 001. Alternatively, the digital circuit of the semiconductor part 002 can be, for example, an LVDS or MIPI interface circuit.

Incidentally, in the semiconductor apparatus 930 that is used as a photoelectric conversion apparatus, on the semiconductor layer 200, a dielectric film 500 including a dielectric layer 511, a dielectric layer 512, and a dielectric layer 513 is disposed. On the dielectric film 500, a color filter 514 and microlenses 515 are disposed. Between the dielectric film 500 and the color filter 514 or the microlenses 515, for example, a light-shielding film formed of a film of a metal such as tungsten and used for forming an OB region, or a light-shielding wall for isolation among light from the pixels and prevention of color mixture of the light can be disposed.

Figure 1B:
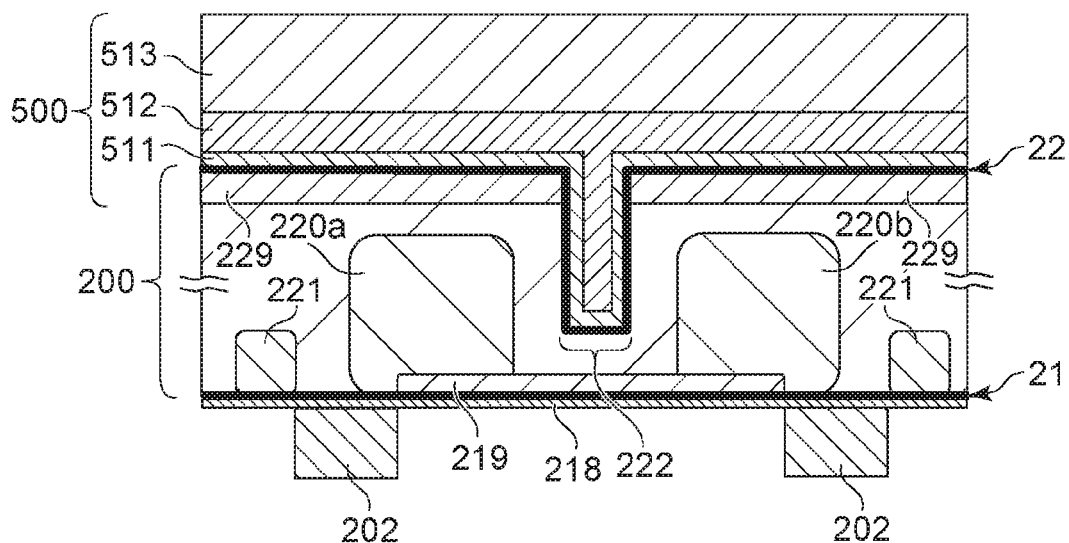

FIG. 1B is an enlarged sectional view of a region including the semiconductor layer 200, which is a silicon layer. The semiconductor layer 200 includes a front surface 21 and a back surface 22. The back surface 22 is a surface on a side opposite from the front surface 21. Between the front surface 21 and the back surface 22, the photoelectric conversion unit 220 is disposed. At the front surface 21, a MOS transistor is disposed. The MOS transistor includes a gate insulating film 218 in contact with the front surface of the semiconductor layer 200, and a gate electrode 202 disposed on the front surface 21 with the gate insulating film 218 therebetween, and a source/drain 221 disposed in the semiconductor layer 200. In FIG. 1B, the MOS transistor is a transfer transistor; the source of the transfer transistor is the photoelectric conversion unit 220, and the drain 221 is a floating diffusion. The semiconductor layer 200 includes a photoelectric conversion unit 220a and a photoelectric conversion unit 220b; in the semiconductor layer 200, a trench 222 is formed between the photoelectric conversion unit 220a and the photoelectric conversion unit 220b. The side surfaces of the trench 222 are portions of the back surface 22. The trench 222 makes the semiconductor layer 200 discontinuous between the photoelectric conversion unit 220a and the photoelectric conversion unit 220b. This achieves electrical and/or optical isolation between the photoelectric conversion unit 220a and the photoelectric conversion unit 220b. Incidentally, the trench 222 can be omitted; when the trench 222 is omitted, as illustrated in FIG. 1A, the back surface 22 is flat, and the semiconductor layer 200 can be continuous between the photoelectric conversion unit 220a and the photoelectric conversion unit 220b.

In a region extending 100 nm from the back surface 22 to the inside of the semiconductor layer 200, a P++ type impurity region 229 is positioned. The impurity region 229 has boron concentrations of more than $1\times10^{20}$ [atoms/cm$^3$]. Thus, in the region extending 100 nm from the back surface 22, the maximum value of the boron concentrations is more than $1\times10^{20}$ [atoms/cm$^3$]. This maximum value can be more than $2\times10^{20}$ [atoms/cm$^3$]. This maximum value may be more than $5\times10^{20}$ [atoms/cm$^3$], may be more than $2\times10^{21}$ [atoms/cm$^3$], and may be more than $5\times10^{21}$ [atoms/cm$^3$]. The position at which the boron concentrations have the maximum value can be in a region extending 50 nm from the back surface 22. Stated another way, in a region extending 100 nm from the back surface 22, the boron concentrations can have a maximum value of more than $1\times10^{20}$ [atoms/cm$^3$]. At the position of 50 nm from the back surface 22, the boron concentrations can be more than $1\times10^{18}$ [atoms/cm$^3$]. In the whole region extending 50 nm from the back surface 22, the boron concentrations can be more than $1\times10^{18}$ [atoms/cm$^3$]. This maximum value can be less than $5\times10^{22}$ [atoms/cm$^3$]. This is because pure silicon single crystals have a silicon density of $5\times10^{22}$ [atoms/cm$^3$]. In the impurity region 229, when the boron content is higher than the silicon content, the silicon crystallinity degrades; for this reason, in the impurity region 229, the boron content can be lower than the silicon content. The maximum value may be less than $1\times10^{22}$ [atoms/cm$^3$], may be less than $5\times10^{21}$ [atoms/cm$^3$], and may be less than $1\times10^{21}$ [atoms/cm$^3$].

In the semiconductor layer 200, a P+ type impurity region 219 is positioned in contact with the front surface 21. This impurity region 219 may have boron concentrations less than the boron concentrations of the impurity region 229. Thus, in a region extending 100 nm from the front surface 21, the boron concentrations may have a maximum value less than the maximum value of the boron concentrations in the region extending 100 nm from the back surface 22.

As described later, formation of the back surface 22 involves the step of thinning the semiconductor layer, during which the semiconductor layer is considerably damaged. Because of this damage, the back surface 22 can be a noise source. Thus, in backside illumination photoelectric conversion apparatuses, more noise can be generated than in front-side illumination photoelectric conversion apparatuses. In order to reduce the effect of noise from the back surface 22 as the noise source, it is effective to constitute the back surface 22 by a P type impurity region. In an existing backside illumination photoelectric conversion apparatus, the back surface 22 is constituted by a P type impurity region; however, this P type impurity region has a low boron concentration, so that a potential barrier sufficient for reducing the noise cannot be formed. In this embodiment, the impurity region 229 is formed such that the boron concentrations have a maximum value of more than $1 \times 10^{20}$ [atoms/cm$^3$], to thereby considerably reduce the noise, compared with existing backside illumination photoelectric conversion apparatuses. In addition, as the dielectric film 500 in contact with the back surface 22, a dielectric layer 511 and a dielectric layer 512 described later may be used, to thereby considerably reduce the noise, compared with existing backside illumination photoelectric conversion apparatuses.

The above-described P++ type impurity region 229 can be formed by various methods, and can be mainly formed by three methods. The first method is a method in which, before formation of transistors and the like, the P++ type impurity region 229 is formed by epitaxial growth. The second method is a method of injecting an impurity through the front surface 21 to form the P++ type impurity region 229. The third method is a method of injecting an impurity through a surface on a side opposite from the front surface 21 to thereby form the P++ type impurity region 229. The second method involves ion injection at a relatively high energy of several mega electron volts through the front surface 21, so that the impurity region 229 tends to have a large thickness, which is disadvantageous in achieving an increase in the size of the photoelectric conversion unit 220. In addition, boron diffuses during, for example, the step of forming transistors, which is also disadvantageous in achieving a high concentration of the impurity region 229. By contrast, in the third method, the semiconductor layer is thinned and then an impurity is introduced through a surface opposite from the front surface 21, to thereby form, with a low energy hence low damage, the impurity region 229 that has a small thickness and a high concentration.

On the back surface 22, the dielectric film 500 is disposed in contact with the back surface 22. The dielectric film 500 may be a monolayer film, but can be a multilayer film. The dielectric film 500 that is a multilayer film may include a dielectric layer 511, a dielectric layer 512, and a dielectric layer 513. The dielectric film 500 can include, in a region extending 10 nm from the back surface 22, a dielectric layer 511 having negative fixed charges. As the dielectric layer 511 having negative fixed charges, a metal oxide layer can be employed. The dielectric layer 511 having negative fixed charges can be disposed near the back surface 22 to thereby achieve a reduction in the noise generated by electrons near the back surface 22. The dielectric layer 511 having negative fixed charges may be, for example, a hafnium oxide layer, an aluminum oxide layer, a zirconium oxide layer, a titanium oxide layer, a tantalum oxide layer, or a ruthenium oxide layer, in particular, is preferably an aluminum oxide layer or a hafnium oxide layer. The dielectric layer 511 having negative fixed charges can have a thickness of 5 nm to 20 nm.

In this example, the dielectric layer 511 is in contact with the back surface 22; alternatively, between the dielectric layer 511 and the back surface 22, a thin dielectric layer having a thickness of less than 10 nm may be disposed. This thin dielectric layer may be, for example, a silicon oxide layer.

The dielectric layer 512 has a function of an antireflection layer. When the dielectric layer 512 is used as an antireflection layer, the dielectric layer 512 can have a thickness larger than the thickness of the dielectric layer 511. The dielectric layer 512 serving as an antireflection layer can have a thickness of 20 nm to 100 nm. The dielectric layer 512 may be a metal oxide layer such as a hafnium oxide layer, an aluminum oxide layer, a zirconium oxide layer, a titanium oxide layer, a tantalum oxide layer, or a ruthenium oxide layer. Alternatively, the dielectric layer 512 may be a silicon compound layer such as a silicon oxide layer, a silicon nitride layer, or a silicon oxynitride layer. Of these dielectric layers, the tantalum oxide layer particularly has a high dielectric constant, and hence is preferred as the dielectric layer 512 serving as an antireflection layer.

The dielectric layer 513 is formed of a material having a lower refractive index than the dielectric layer 512 in order to impart appropriate antireflection properties to the dielectric layer 512. The dielectric layer 513 may be a silicon compound layer such as a silicon oxide layer, a silicon nitride layer, or a silicon oxynitride layer, but alternatively may be a resin layer.

In a region extending 100 nm outward from the back surface 22 of the semiconductor layer 200, a metal oxide layer can be disposed. This metal oxide layer may be the above-described dielectric layer 511 or dielectric layer 512, and may be, for example, a hafnium oxide layer, an aluminum oxide layer, a zirconium oxide layer, a titanium oxide layer, a tantalum oxide layer, or a ruthenium oxide layer. This metal oxide layer is preferably a polycrystalline layer, compared with a monocrystalline layer, and is preferably an amorphous layer, compared with a polycrystalline layer. In particular, in the region extending 100 nm outward from the back surface 22 of the semiconductor layer 200, a tantalum oxide layer is preferably disposed. Of silicon oxide, silicon nitride, aluminum oxide, hafnium oxide, lanthanum oxide, tantalum oxide, and zirconium oxide, tantalum oxide has the highest relative dielectric constant, the smallest band gap, and the smallest conduction band offset relative to Si. The tantalum oxide layer can also be an amorphous layer.

Hereinafter, as production methods applicable to the semiconductor apparatus of the first embodiment, second, third, and fourth embodiments will be described.

Second Embodiment

Hereinafter, a method for producing the semiconductor apparatus 930 according to a second embodiment of the present disclosure will be described. Specifically, a method for producing a wafer 81 for the semiconductor part 001 and a method for producing a wafer 82 for the semiconductor part 002 will be described, and then a method for producing the semiconductor apparatus 930 using these two wafers 81 and 82 will be described.

Figure 2A:
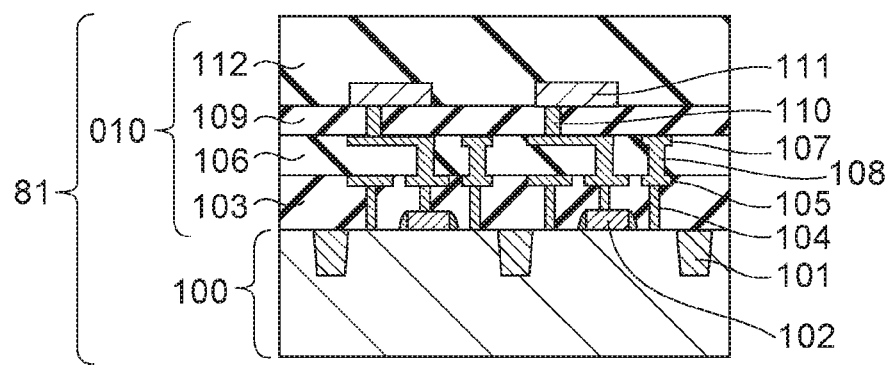
FIGS. 2A to 2D are schematic views of a method for producing a semiconductor apparatus.

First, referring to FIGS. 2A to 2D, the method for producing the wafer 81 for the semiconductor part 001 will be described. Referring to FIG. 2A, the wafer 81 for the semiconductor part 001 is prepared. The wafer 81 includes a semiconductor layer 100, an element isolation section 101, a gate electrode 102 of a transistor, an interlayer insulating film 103, and a contact plug 104. The semiconductor layer 100 can be referred to as a "substrate" or a "semiconductor layer". The semiconductor layer 100 may be a P type silicon wafer or an N type silicon wafer. Alternatively, on a P type or N type silicon wafer, a P− type or N− type single-crystal silicon may be formed by epitaxial growth. The wafer 81 further includes a wiring layer 105, an interlayer insulating film 106, a wiring layer 107, and a via plug 108 connecting the wiring layer 105 and the wiring layer 107 to each other. Incidentally, to the wafer 81, well-known configurations are applicable, and the method for producing the wafer 81 will not be described. On the interlayer insulating film 106, an interlayer insulating film 109 is formed. The interlayer insulating film 109 is, for example, a silicon oxide film, a silicon nitride film, a silicon oxynitride film, a carbon-containing silicon oxide film, or a fluorine-containing silicon oxide film. The layer configuration of the film may be a monolayer configuration formed of a single material, or a multilayer configuration formed of a plurality of materials.

Subsequently, the front surface of the interlayer insulating film 109 is etched to form a trench, and PVD or CVD is performed to form a conductor over the whole front surface to fill the trench with the conductor. For example, chemical mechanical polishing or etch back is performed to remove the conductor over the front surface to thereby form, as illustrated in FIG. 2A, a via plug 110 in the interlayer insulating film 109.

Subsequently, on the interlayer insulating film 109, a conductor film is formed. The material of the conductor film may be aluminum, for example. The conductor film on the interlayer insulating film 109 is subjected to patterning. The patterning is achieved by photolithography and etching, to form a conductor layer 111. Incidentally, in this embodiment, three layers of the wiring layer 105, the wiring layer 107, and the conductor layer 111 are formed; however, the number of such wiring layers can be freely selected. In this embodiment, at the front surface of the semiconductor layer 100, a MOS transistor alone is disposed; however, this embodiment is not limited to this configuration. For example, a MOS capacitor, a trench capacitor, a resistor using a portion of the semiconductor layer 100, or a resistor using the material of the same layer as in the gate electrode 102 of the transistor can be disposed. For example, an MIM capacitor can be disposed between wiring layers.

Subsequently, an insulating film 112 is formed on the interlayer insulating film 109. The insulating film 112 is, for example, a silicon oxide film, a silicon nitride film, a silicon oxynitride film, a carbon-containing silicon oxide film, or a fluorine-containing silicon oxide film. In this case, for example, a silicon oxide film is formed and then planarized by chemical mechanical polishing, to thereby reduce variations in the dimensions of the conductor sections 113.

Figure 2B:
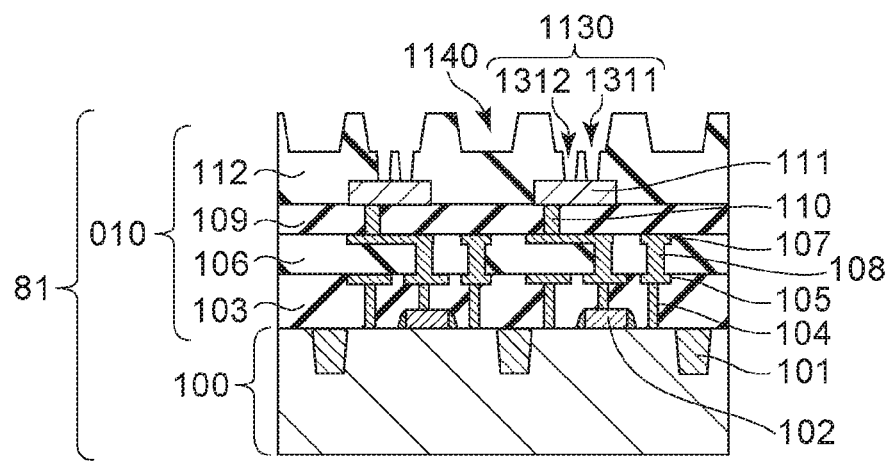

Subsequently, as illustrated in FIG. 2B, a plurality of recesses 1130 in which a conductor material is to be embedded are formed in the insulating film 112. At least portions of the plurality of the recesses 1130 are formed so as to reach the conductor layer 111. Incidentally, the recesses 1130 are arranged at an appropriate density over the whole chip. Each recess 1130 is constituted by a trench 1311 corresponding to a pad 311 in the recess 1130, and a hole (via hole) 1312 corresponding to a via 312. The recesses 1130 can be formed by an etching process for dual damascene. The recesses 1130 can be formed by any of the following processes: a via first process of forming the holes 1312 and then forming the trenches 1311; a trench first process of forming the trenches 1311 and then forming the holes 1312; and a process of simultaneously forming the holes 1312 and the trenches 1311.

Figure 2C:
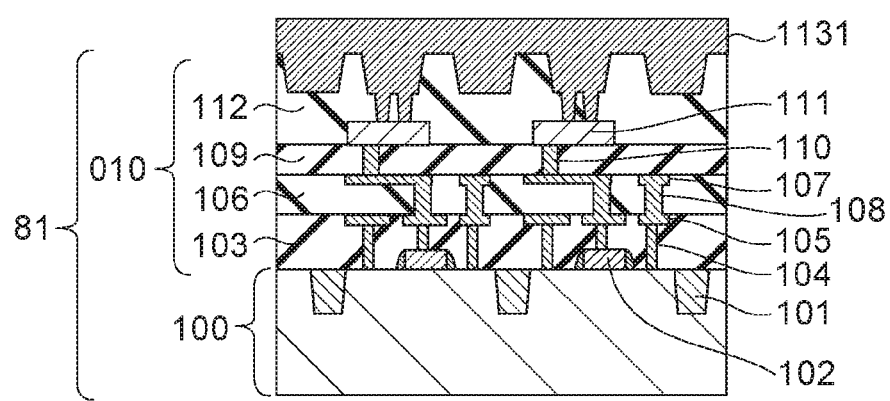

Subsequently, as illustrated in FIG. 2C, a conductor material 1131 is formed over the whole front surface. At this time, the recesses 1130 are filled with the conductor material 1131. The conductor material 1131 may be formed of copper.

Figure 2D:
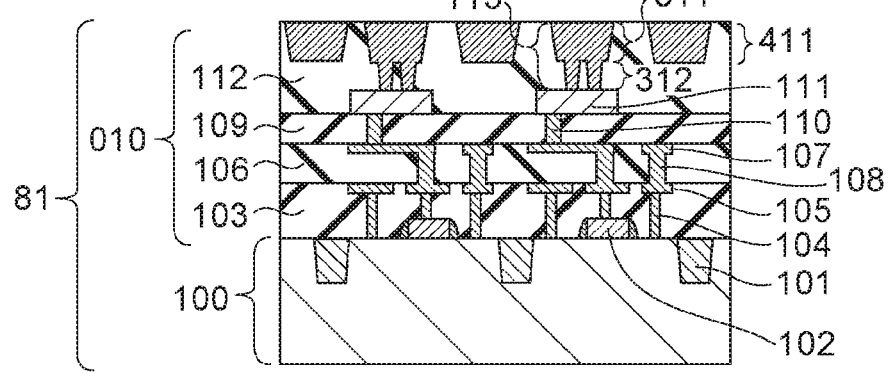

Subsequently, as illustrated in FIG. 2D, chemical mechanical polishing is performed to remove unnecessary portions of the conductor material 1131, to form the conductor sections 113. Specifically, pads 311 and vias 312 disposed at the bottoms of the pads are formed. As a result of the steps having been described so far, the wafer 81 for the semiconductor part 001 to be bonded is produced.

Incidentally, during the chemical mechanical polishing, the conductor sections 113 are formed at an appropriate density over the whole chip, to thereby suppress dishing or erosion due to the chemical mechanical polishing. Thus, the front surface of the wafer 81 for the semiconductor part 001 to be bonded has improved planarity. This achieves an increase in the yield of bonding together of wafers. The planarized uppermost surface of the wafer 81 for the semiconductor part 001 can be constituted by the conductor sections 113 and the insulating film 112.

Hereinafter, referring to FIGS. 3A to 3D, the method for producing the wafer 82 for the semiconductor part 002 will be described.

Figure 3A:
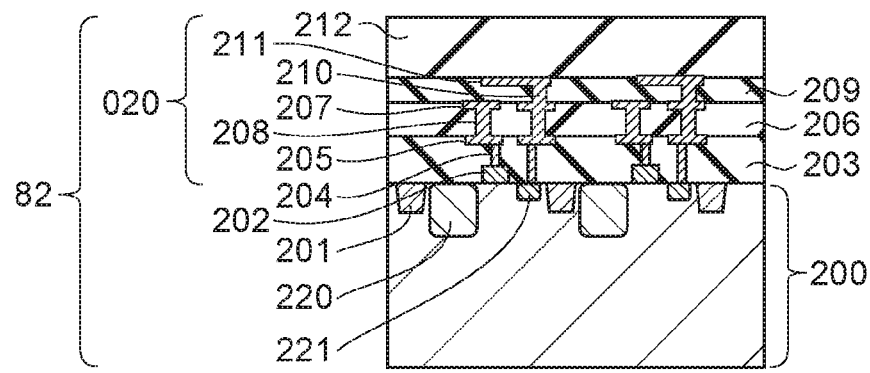
FIGS. 3A to 3D are schematic views of a method for producing a semiconductor apparatus.

Referring to FIG. 3A, which illustrates a portion of the wafer 82 for the semiconductor part 002, the wafer 82 is prepared. The wafer 82 includes a semiconductor layer 200, an element isolation section 201, a gate electrode 202, an interlayer insulating film 203, and a contact plug 204. In the wafer 82, a portion that will be eventually processed into a thin semiconductor layer 200 can be referred to as a "semiconductor layer". The semiconductor layer may be a P type silicon wafer or an N type silicon wafer. Alternatively, the semiconductor layer may have a configuration in which, on a P type or N type silicon wafer, a P− type or N− type single-crystal silicon is formed by epitaxial growth. In the semiconductor layer 200, a photoelectric conversion unit 220 and a source/drain 221 are disposed. The wafer 82 further includes a wiring layer 205, an interlayer insulating film 206, a wiring layer 207, and a via plug 208 connecting the wiring layer 205 and the wiring layer 207 to each other. The wafer 82 further includes an interlayer insulating film 209, a conductor layer 211, and a via plug 210 connecting the wiring layer 207 and the conductor layer 211 to each other. Incidentally, the wafer 82 can be produced by a well-known technique, and the method for producing the wafer 82 will not be described.

In this embodiment, at the front surface of the semiconductor layer 200, a MOS transistor alone is disposed; however, this embodiment is not limited to this configuration. For example, a MOS capacitor, a trench capacitor, a resistor using a portion of the semiconductor layer 200, or a resistor using the gate electrode 202 can be disposed. For example, an MIM capacitor can be disposed between wiring layers.

On the interlayer insulating film 209, an insulating film 212 is formed. The insulating film 212 is, for example, a silicon oxide film, a silicon nitride film, a silicon oxynitride film, a carbon-containing silicon oxide film, or a fluorine-containing silicon oxide film.

Figure 3B:
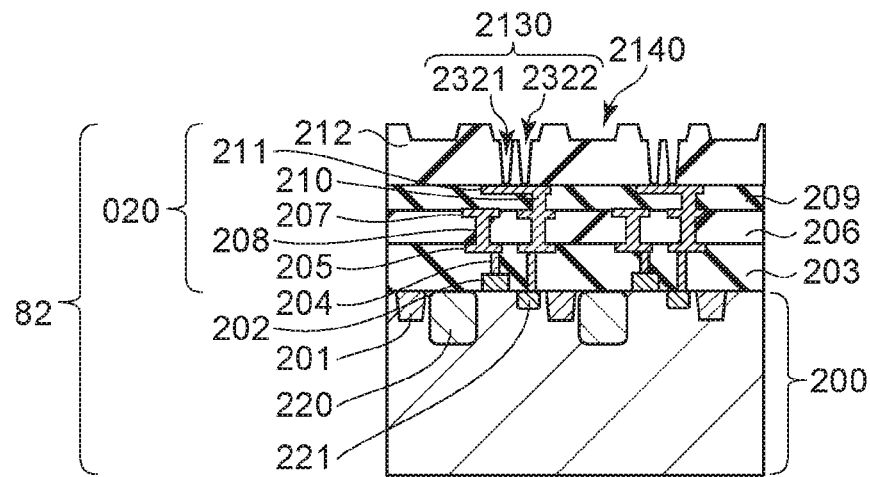

Subsequently, as illustrated in FIG. 3B, a plurality of recesses 2130 in which a conductor material is to be embedded are formed in the insulating film 212. At least portions of the plurality of recesses 2130 are formed so as to reach the conductor layer 211. Incidentally, these recesses 2130 are arranged at an appropriate density over the whole chip.

Figure 3C:
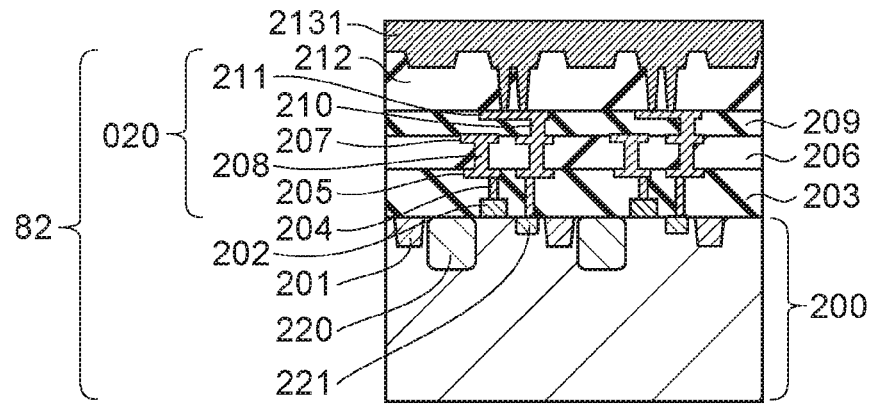

Subsequently, as illustrated in FIG. 3C, a conductor material 2131 is formed over the whole front surface of the insulating film 212. At this time, the recesses 2130 are filled with the conductor material 2131. The conductor material 2131 may be formed of copper.

Figure 3D:
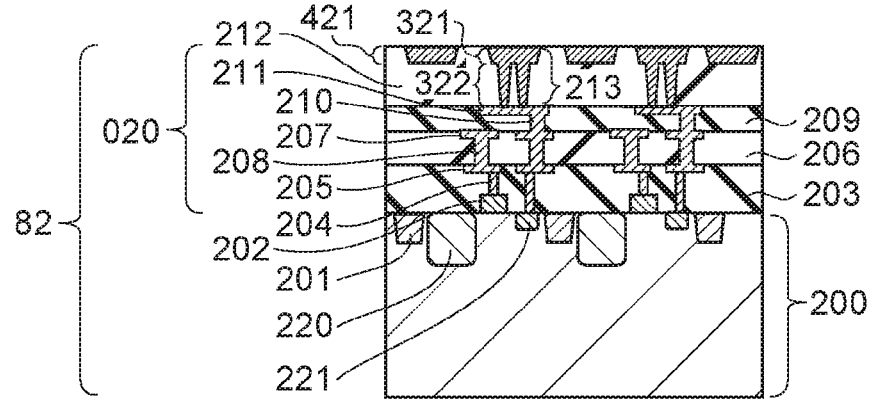

Subsequently, as illustrated in FIG. 3D, chemical mechanical polishing is performed to remove unnecessary portions of the conductor material 2131, to form conductor sections 213 connected to the conductor layer 211. Specifically, pads 321 and vias 322 disposed at the bottoms of the pads 321 are formed. This completes the wafer 82 for the semiconductor part 002 to be bonded. Incidentally, during the chemical mechanical polishing, the recesses 2130 are arranged at an appropriate density over the whole chip, to thereby suppress dishing or erosion due to the chemical mechanical polishing. Thus, the front surface of the wafer 82 for the semiconductor part 002 to be bonded has improved planarity. The planarized uppermost surface of the wafer 82 for the semiconductor part 002 can be constituted by the conductor sections 213 and the insulating film 212.

Hereinafter, referring to FIG. 4A to FIG. 4D, the method for producing the semiconductor apparatus 930 will be described.

Figure 4A:
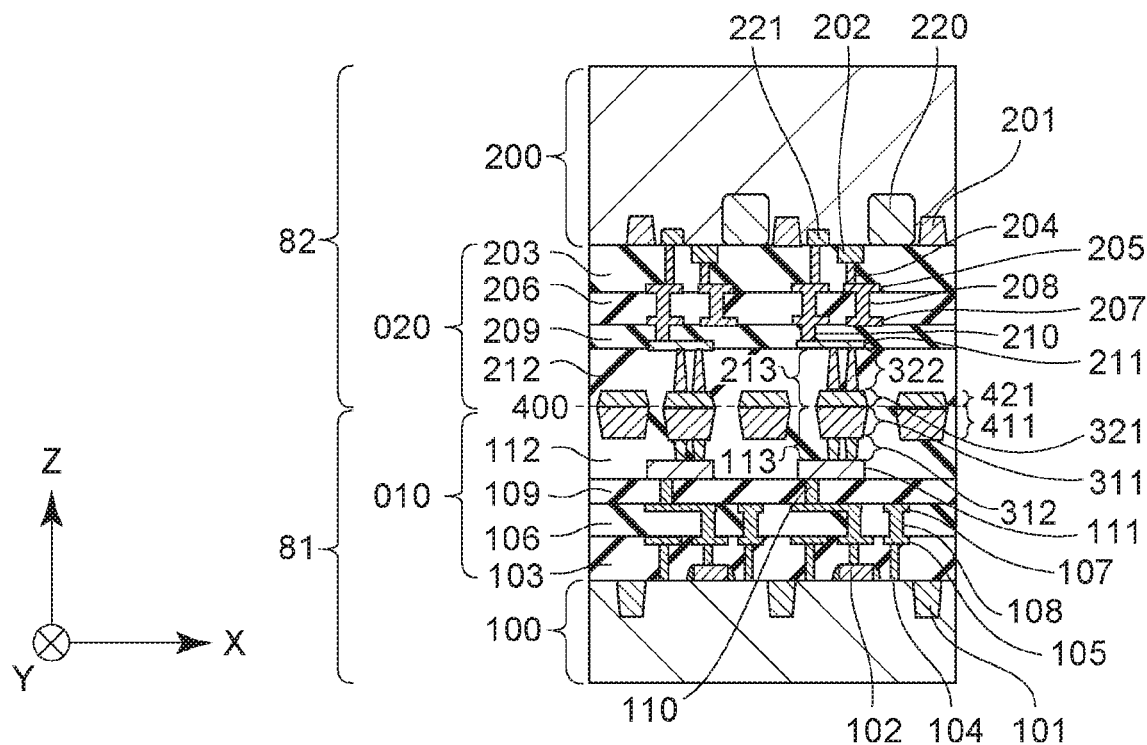
FIGS. 4A to 4D are schematic views of a method for producing a semiconductor apparatus.

As illustrated in FIG. 4A, the wafer 82 for the semiconductor part 002 is inverted, and the wafer 81 for the semiconductor part 001 and the wafer 82 for the semiconductor part 002 are bonded together at a bonding interface 400. This bonding provides a structure in which, on the wafer 81 for the semiconductor part 001, the wafer 82 for the semiconductor part 002 is disposed. For example, the wafers are bonded together in the following manner. First, plasma activation is performed to activate the insulating films 112 and 212 of the wafers serving as bonding surfaces, and the activated insulating films 112 and 212 are bonded together to thereby temporarily bond the semiconductor wafers together. Subsequently, for example, a heat treatment is performed to thereby bond together the insulating film 112 and the insulating film 212 at the bonding interface 400 more firmly than in the temporary bonding. In this way, the semiconductor layer 200 is prepared, the semiconductor layer 200 including a front surface at which a transistor is disposed, an opposite surface on a side opposite from the front surface, and a photoelectric conversion unit 220 disposed between the front surface and the opposite surface.

The semiconductor layer 200 is then subjected to a thinning step such that a surface opposite from the front surface becomes a light-receiving surface (back surface 22). Hereinafter, the thinning step will be described.

Figure 4B:
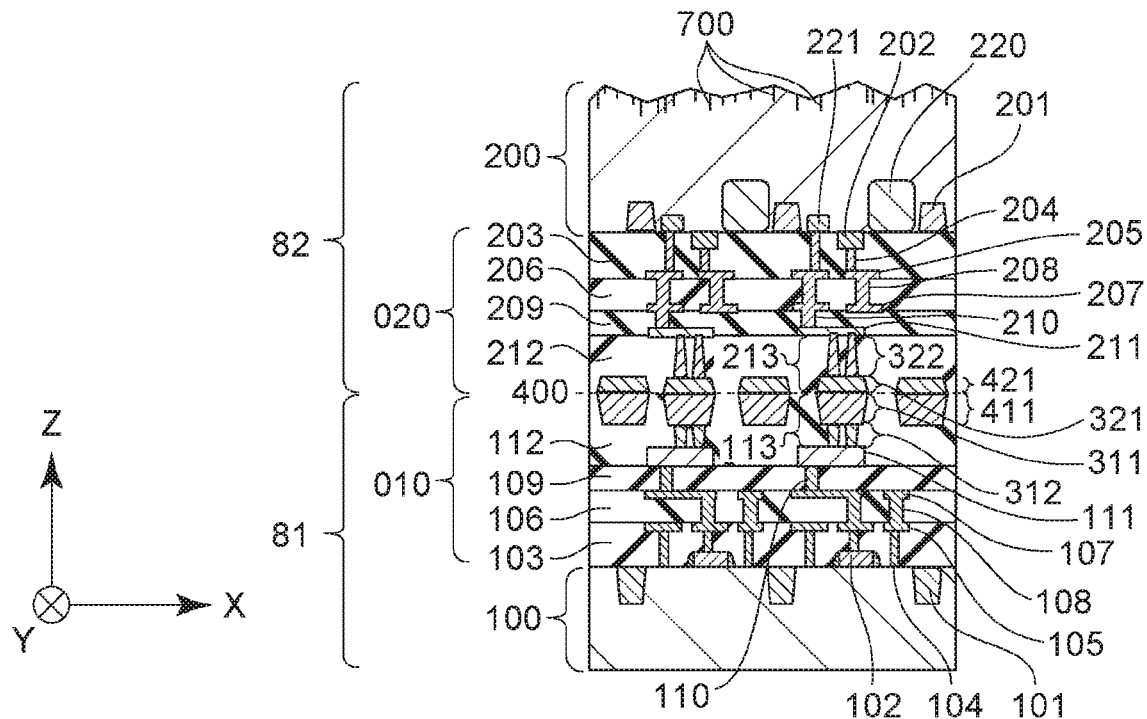

First, as illustrated in FIG. 4B, a first thinning step of performing mechanical grinding to thin the semiconductor layer 200 is performed. The first thinning step has a fast processing speed, which enables an increase in the throughput of the production steps. However, the mechanical grinding is known to roughen silicon surfaces. Such a roughened region is a cracked layer 700. The cracked layer 700 is a layer including distorted crystals and crystal defects. When this cracked layer 700 is left as it is, the semiconductor layer 200, which is to serve as the light-receiving surface of the photoelectric conversion unit 220 in FIG. 1A, has the remaining crystal defects, which results in degradation of properties of the photoelectric conversion apparatus in terms of, for example, dark current. For addressing this, in order to remove the cracked layer 700 and to remove foreign substances from and to planarize the light-receiving surface of the photoelectric conversion unit 220, the mechanical grinding may be followed by chemical mechanical polishing.

Figure 4C:
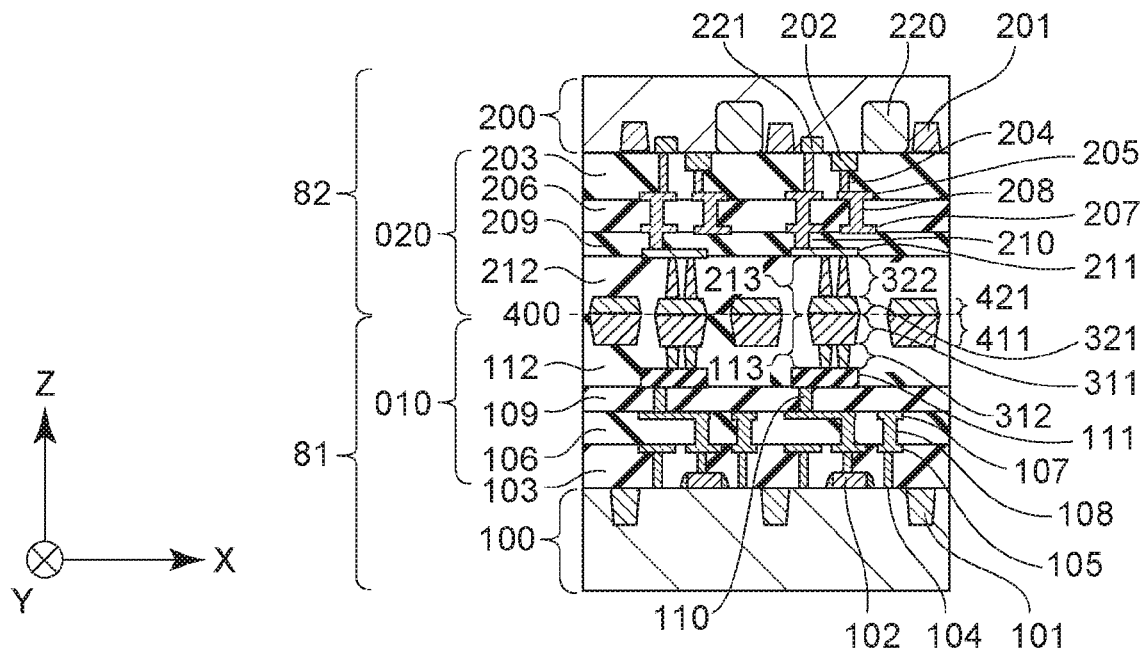

Subsequently, as illustrated in FIG. 4C, a second thinning step of performing wet etching to thin the semiconductor layer 200 is performed. The etchant is, for example, a mixed reagent liquid of hydrofluoric acid (HF) and nitric acid ($HNO_3$). As treatment conditions of the wet etching, for example, the following treatment conditions can be employed.

Reagent liquid temperature: 20 to 30° C.
Reagent liquid mixing ratio ($HF:HNO_3$)=1:10 to 1:100
Treatment time: 100 to 300 seconds The wet etching is performed to etch the semiconductor layer 200, to thereby completely remove the cracked layer 700 generated by the mechanical grinding. Specifically, as illustrated in FIG. 1A, the crystal defects can be completely removed. Thus, a method for producing a highly reliable photoelectric conversion apparatus that has good photoelectric-conversion-apparatus properties in terms of, for example, dark current can be provided.

Figure 4D:
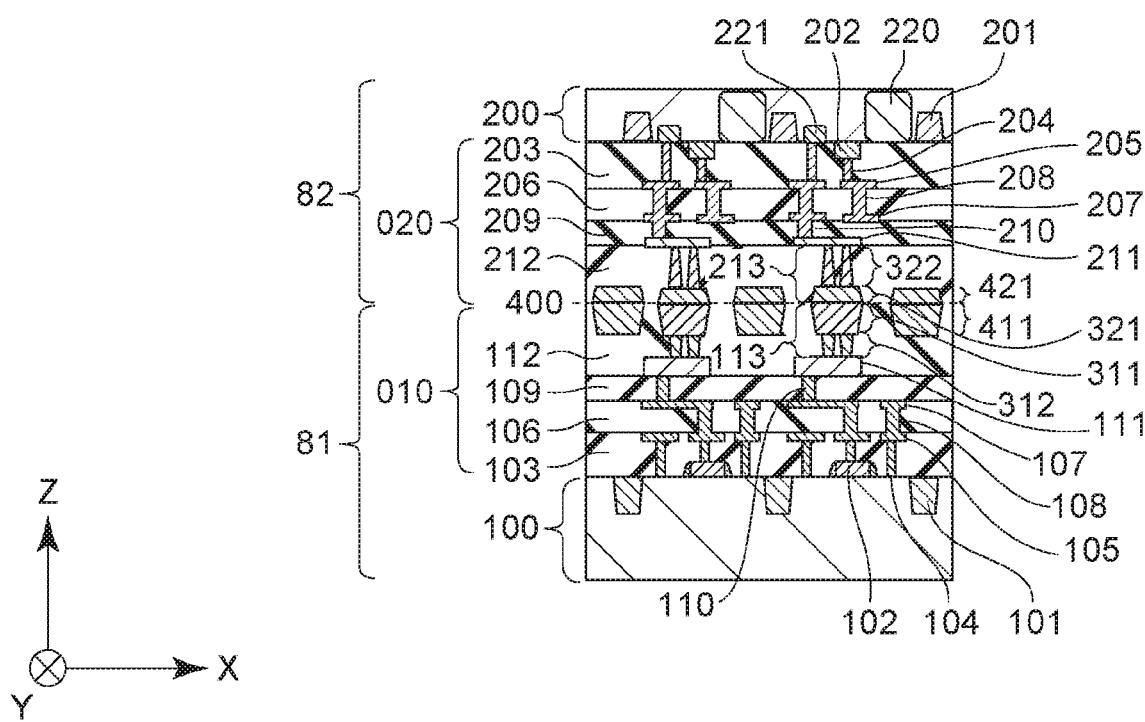

Subsequently, as illustrated in FIG. 4D, a third thinning step of performing chemical mechanical polishing to thin the semiconductor layer 200 is performed. For example, an optical film-thickness end-point monitoring CMP process is used, so that thinning is performed while the film thickness of the semiconductor layer 200 is monitored. This step can dictate the planarity of the light-receiving surface of the photoelectric conversion unit 220 and the film-thickness uniformity of the semiconductor layer 200.

Figure 5A:
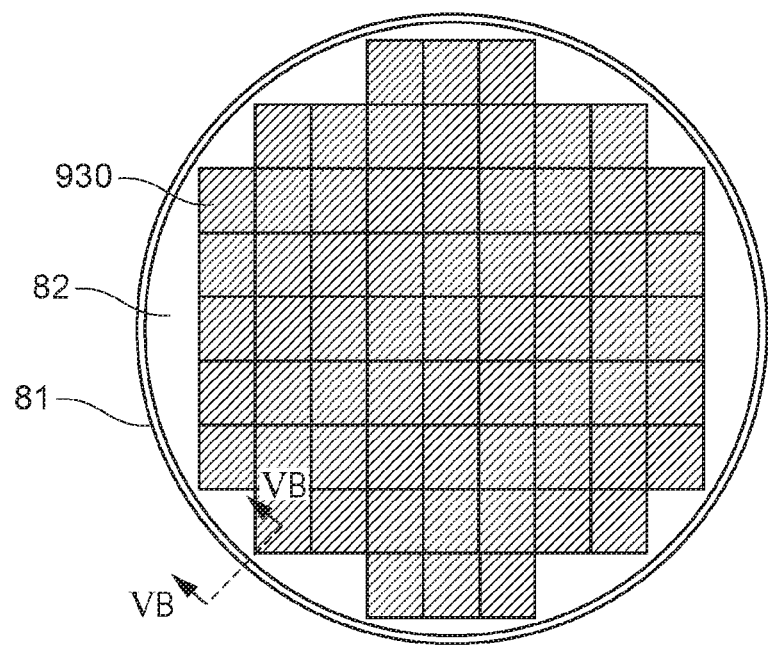
FIGS. 5A and 5B are schematic views of a semiconductor apparatus and a method for producing a semiconductor apparatus.
Figure 5B:
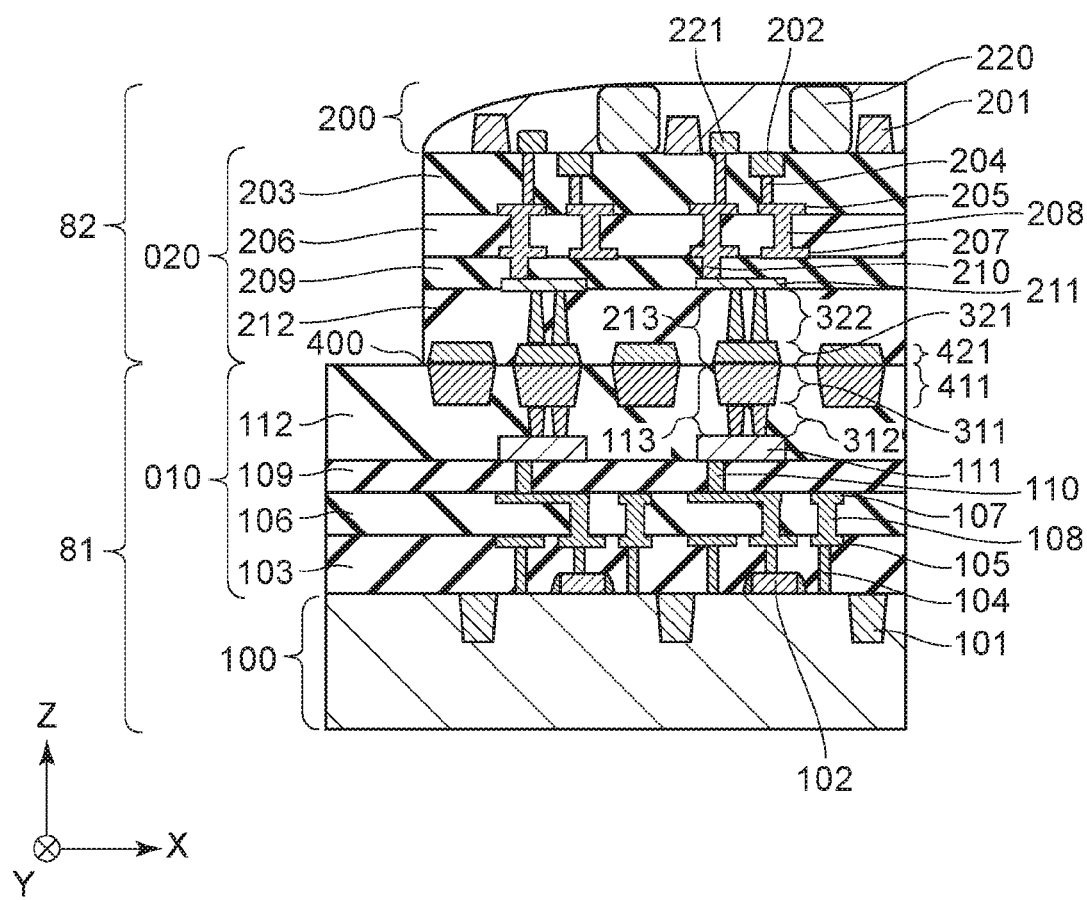

FIG. 5A illustrates a semiconductor layer in which the wafer 81 for the semiconductor part 001 and the wafer 82 for the semiconductor part 002 are bonded together to form the semiconductor apparatuses 930. FIG. 5B is a sectional view of the semiconductor layer in FIG. 5A, taken along line VB-VB in the periphery of the semiconductor layer. When the amount of the semiconductor layer 200 removed by the chemical mechanical polishing is larger than the amount of the semiconductor layer 200 removed by the wet etching, as illustrated in FIG. 5B, in the semiconductor apparatus 930 formed in the periphery of the semiconductor layer, the semiconductor layer 200 has a small thickness. This is because the polishing pad of the chemical mechanical polishing tends to attack the corner of the semiconductor layer 200, to reduce the level difference. When the semiconductor layer 200 has such a small thickness, light incident on the photoelectric conversion units 220 has different optical path lengths. This affects the optical characteristics of such photoelectric conversion apparatuses, which results in a decrease in the pass rate of the semiconductor apparatuses 930 in the periphery of the semiconductor layer, and a decrease in the yield of the semiconductor apparatuses 930. Thus, in order to increase the yield of the semiconductor apparatuses 930, the amount of the semiconductor layer 200 removed by the wet etching is desirably set larger than the amount of the semiconductor layer 200 removed by the chemical mechanical polishing. In addition, from the viewpoint of increasing the throughput of the production steps, the amount of the semiconductor layer 200 removed by the mechanical grinding is desirably set larger than the amount of the semiconductor layer 200 removed by the wet etching. In summary, when the amounts of the semiconductor layer 200 removed in the thinning steps are defined as follows, Amount of removal by mechanical grinding: Eb;
Amount of removal by wet etching: Ew; and
Amount of removal by chemical mechanical polishing: Ec;

the amounts of the semiconductor layer 200 removed in the thinning steps are desirably set so as to satisfy Eb>Ew>Ec.

Thus, the planarity of the light-receiving surface of the photoelectric conversion unit 220 can be improved, and crystal defects can be completely removed, to provide a method for producing a highly reliable photoelectric conversion apparatus that has good photoelectric-conversion-apparatus properties in terms of, for example, dark current.

Subsequently, as illustrated in FIG. 1A, on the front surface of the semiconductor layer 200 of the wafer 82 for the semiconductor part 002, a dielectric layer 511, a dielectric layer 512, and a dielectric layer 513 are formed. The dielectric layer 511 is, for example, a hafnium oxide layer or an aluminum oxide layer. The dielectric layer 512 is, for example, a tantalum oxide layer. The dielectric layer 513 may be formed of a material freely selected from materials generally used for semiconductor apparatuses. Examples of the material include a silicon oxide film, a silicon nitride film, a silicon oxynitride film, a carbon-containing silicon oxide film, and a fluorine-containing silicon oxide film. Such a film may have a layer configuration that is a monolayer configuration formed of a single material, or a multilayer configuration formed of a plurality of materials. In addition, in the dielectric layer 513, for example, a light-shielding film formed of a film of a metal such as tungsten and used for an OB region, or a light-shielding wall for isolation among light from the pixels and prevention of color mixture of the light may be formed (not shown). Incidentally, on the semiconductor layer 200, a color filter 514 and microlenses 515 may be formed. In the semiconductor layer 200, an opening (pad opening) may be formed so as to reach a pad electrode included in the wiring structure 010 or the wiring structure 020. In the semiconductor layer 100, a through-via (TSV) extending through the semiconductor layer 100 may be formed so as to be connected to an electrode included in the wiring structure 010 or the wiring structure 020.

Third Embodiment

Hereinafter, a method for producing the semiconductor apparatus 930 according to a third embodiment will be described. In this embodiment, the method for producing the wafer 81 for the semiconductor part 001 is similar to that of the second embodiment, and hence will not be described. Thus, the method for producing the wafer 82 for the semiconductor part 002, which is different from that of the second embodiment, will be described and then the method for producing the semiconductor apparatus 930 using these two wafers 81 and 82 will be described.

First, referring to FIGS. 6A to 6D, the method for producing the wafer 82 for the semiconductor part 002 will be described.

Figure 6A:
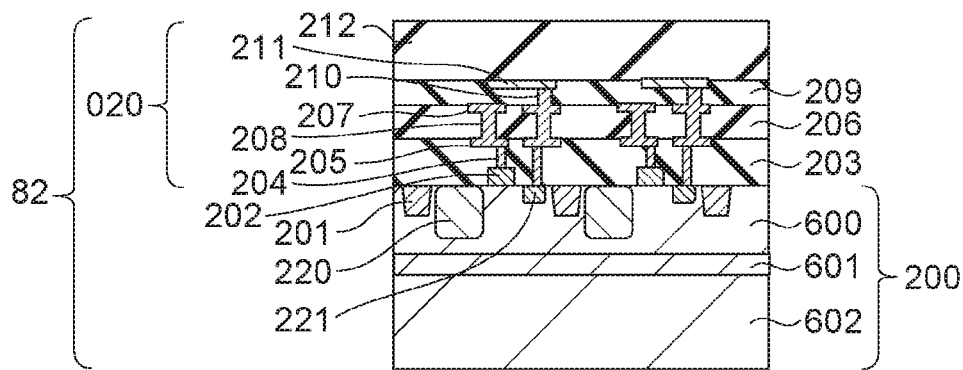
FIGS. 6A to 6D are schematic views of a method for producing a semiconductor apparatus.

Referring to FIG. 6A, which illustrates a portion of the wafer 82 for the semiconductor part 002, the wafer 82 is prepared. The wafer 82 includes a semiconductor layer 200, an element isolation section 201, a gate electrode 202, an interlayer insulating film 203, and a contact plug 204. The semiconductor layer 200 can be referred to as a "substrate" or a "semiconductor layer". The semiconductor layer 200 has a bilayer epi structure, specifically has a structure in which, on a P type or N type impurity region 602, a P+ type impurity region 601 and a P− type or N− type impurity region 600 are formed in this order by epitaxial growth. The P+ type impurity region 601 has a concentration of a P type impurity such as boron (B) of $1\times10^{19}$ [atoms/cm$^3$] or more. The roles of the P type or N type impurity region 602, the P+ type impurity region 601, and the P− type or N− type impurity region 600 will be described later in detail.

Figure 6B:
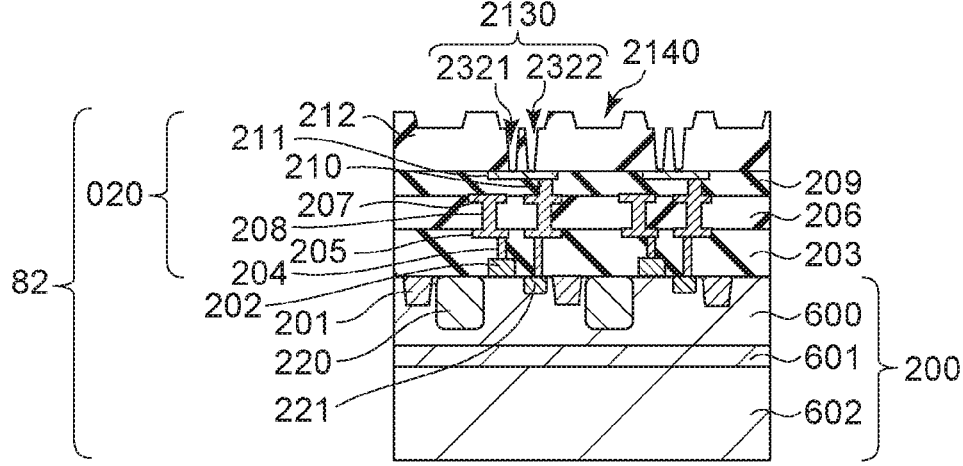
Figure 6C:
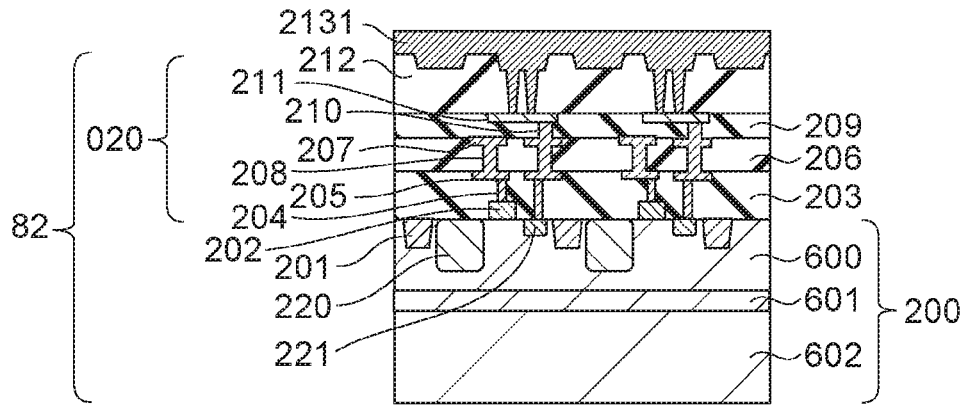
Figure 6D:
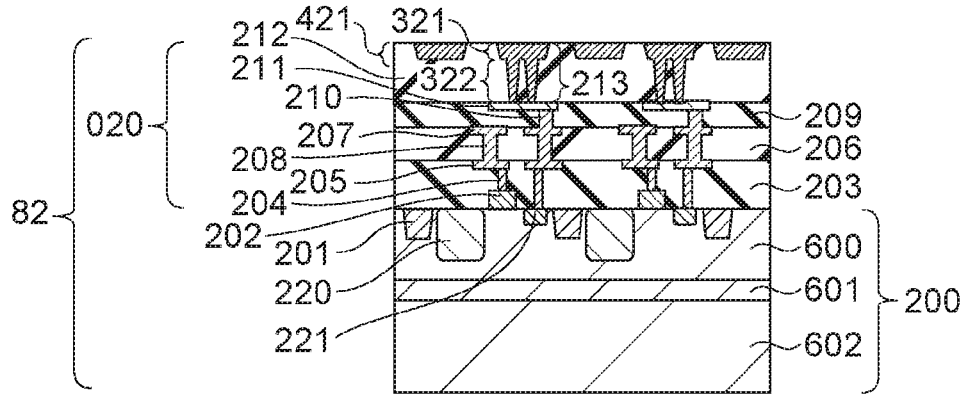

Subsequently, steps in FIGS. 6B to 6D are performed to complete the wafer 82 for the semiconductor part 002. These steps are similar to those in FIG. 3B to FIG. 3D, and hence will not be described.

Figure 7A:
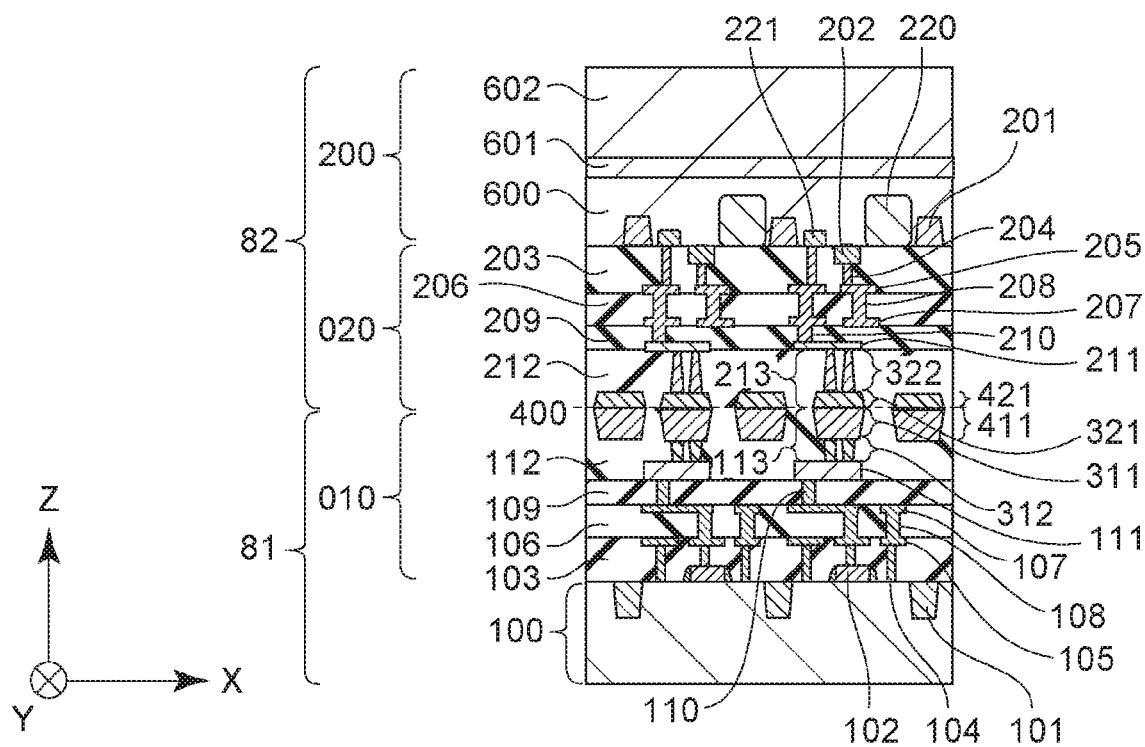
FIGS. 7A to 7D are schematic views of a method for producing a semiconductor apparatus.

Subsequently, referring to FIG. 7A to FIG. 7D, the method for producing the semiconductor apparatus 930 will be described. As illustrated in FIG. 7A, the wafer 82 for the semiconductor part 002 is inverted, and the wafer 81 for the semiconductor part 001 and the wafer 82 for the semiconductor part 002 are bonded together at a bonding interface 400. This bonding provides a structure in which, on the wafer 81 for the semiconductor part 001, the wafer 82 for the semiconductor part 002 is disposed. For example, the wafers are bonded together in the following manner. First, plasma activation is performed to activate the insulating films 112 and 212 of the wafers serving as bonding surfaces, and the activated insulating films 112 and 212 are bonded together to thereby temporarily bond the semiconductor wafers together. Subsequently, for example, a heat treatment is performed, to bond together the insulating film 112 and the insulating film 212 at the bonding interface 400 more firmly than in the temporary bonding. In this way, the semiconductor layer 200 is prepared, the semiconductor layer 200 including a front surface at which a transistor is disposed, an opposite surface on a side opposite from the front surface, and a photoelectric conversion unit 220 disposed between the front surface and the opposite surface.

Figure 7B:
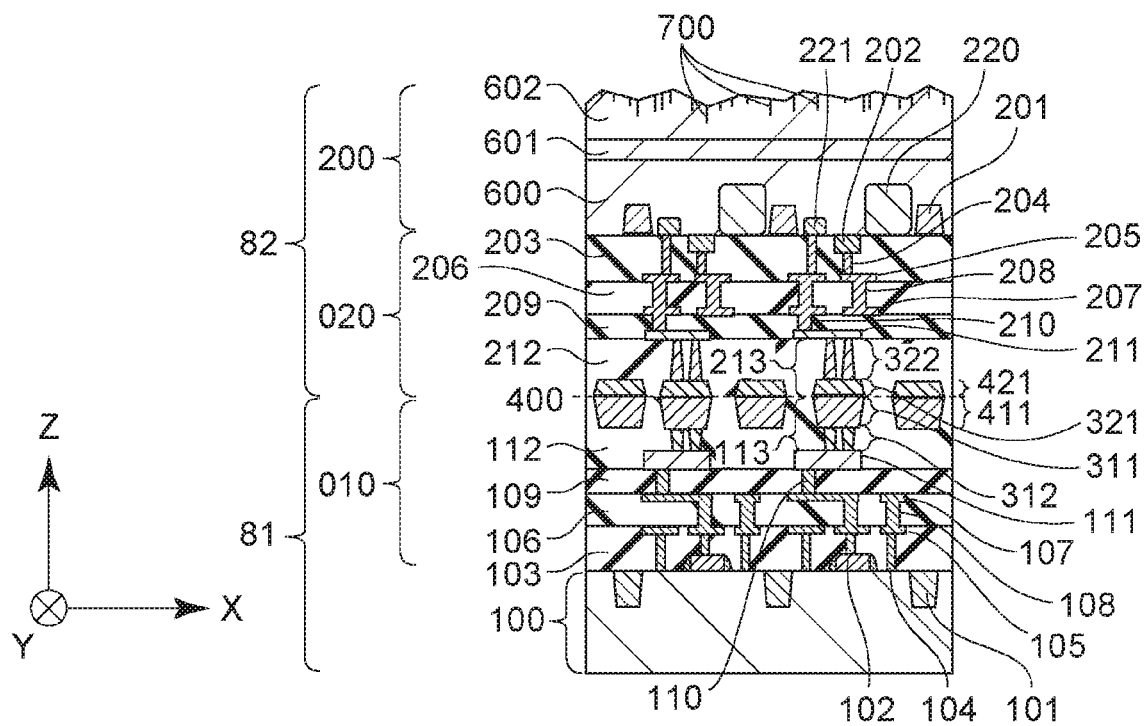

Subsequently, as illustrated in FIG. 7B, a first thinning step of thinning the P type or N type impurity region 602 of the semiconductor layer 200 is performed. The first thinning step has a fast processing speed, which enables an increase in the throughput of the production steps.

Figure 7C:
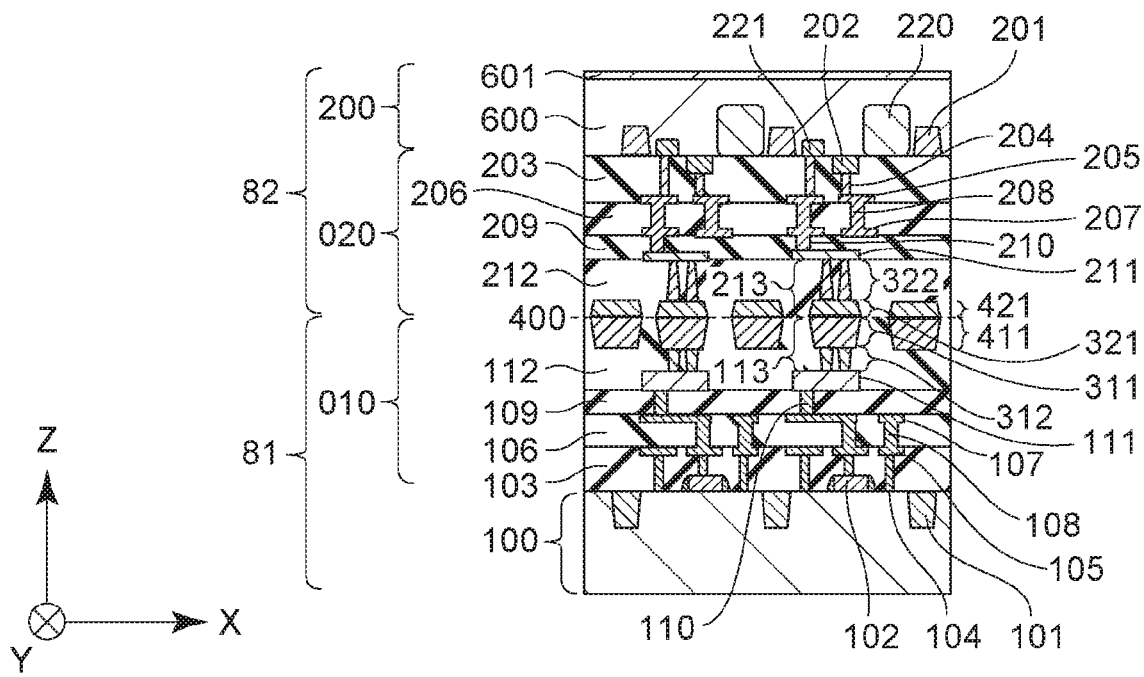

Subsequently, as illustrated in FIG. 7C, a second thinning step of performing a first wet etching to thin the whole P type or N type impurity region 602 and the P+ type impurity region 601 of the semiconductor layer 200 is performed. As the first etchant, for example, a mixed reagent liquid of hydrofluoric acid (HF) and nitric acid (HNO$_3$) is employed. As the treatment conditions of the first wet etching, for example, the following treatment conditions can be employed.

Figure 7D:
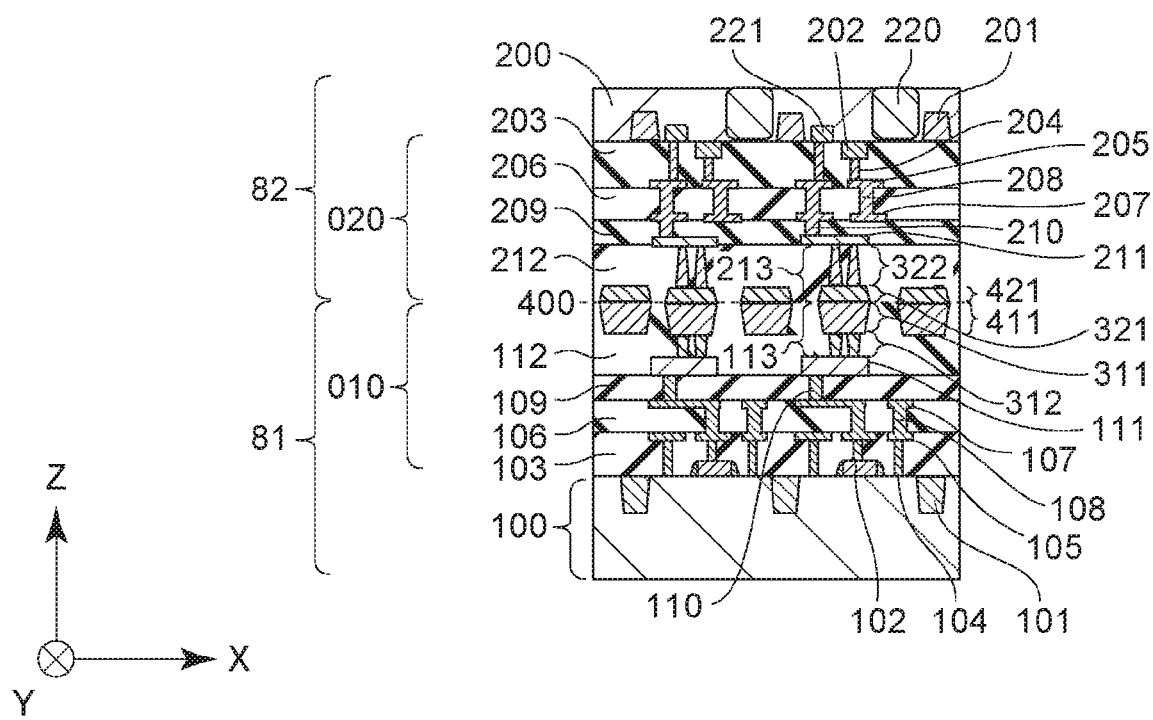

Reagent liquid temperature: 20 to 30° C.
Reagent liquid mixing ratio (HF:HNO$_3$)=1:10 to 1:100
Treatment time: 100 to 300 seconds Subsequently, as illustrated in FIG. 7D, a third thinning step of performing a second wet etching to selectively etch only the P+ type impurity region 601 of the semiconductor layer 200 is performed. Thus, the etching is stopped at the P− type or N− type impurity region 600. The P− type or N− type impurity region 600 having a low impurity concentration functions as an etching stopper. As the second etchant, for example, a mixed reagent liquid of hydrofluoric acid (HF), nitric acid (HNO$_3$), and acetic acid (CH$_3$COOH) is employed. As the treatment conditions of the second wet etching, for example, the following treatment conditions can be employed.

Reagent liquid temperature: 20 to 30° C.
Relationship among reagent liquid mixing proportions (HF:HNO$_3$:CH$_3$COOH): HF<HNO$_3$<CH$_3$COOH
Treatment time: 10 to 200 seconds As described above, the wet etching in the second and third thinning steps includes the first wet etching using the first etchant and the second wet etching performed after the first wet etching and using the second etchant. The second etchant contains CH$_3$COOH in an amount larger than that in the first etchant. Incidentally, in this example, the first etchant has a CH$_3$COOH content of zero; alternatively, the first etchant may contain CH$_3$COOH in an amount smaller than that in the second etchant. This second etchant enables selective etching directed only to an impurity region having a P type impurity concentration of $1\times10^{19}$ [atoms/cm$^3$] or more. In the first wet etching and the second wet etching, the P type or N type impurity region 602 and the P+ type impurity region 601 of the semiconductor layer 200 are etched, to thereby completely remove the cracked layer 700 generated by the mechanical grinding. The second wet etching is performed to selectively etch only the P+ type impurity region 601 of the semiconductor layer 200, to thereby stop the etching at the P− type or N− type impurity region 600. In other words, in the second wet etching, the P− type impurity region or the N− type impurity region is used as an etching stopper during etching of the P+ type impurity region. As a result, as illustrated in FIG. 1A, the planarity of the light-receiving surface of the photoelectric conversion unit 220 can be improved, and the crystal defects can be completely removed, to provide a method for producing a highly reliable photoelectric conversion apparatus that has good photoelectric-conversion-apparatus properties in terms of, for example, dark current. Incidentally, in order to remove the cracked layer 700 and to remove foreign substances from and to planarize the light-receiving surface of the photoelectric conversion unit 220, a thinning step of performing chemical mechanical polishing may be additionally performed between the mechanical grinding and the wet etching.

Subsequently, as illustrated in FIG. 7D, a fourth thinning step of performing chemical mechanical polishing to thin the semiconductor layer 200 is performed. For example, an optical film-thickness end-point monitoring CMP process is used, so that thinning is performed while the film thickness of the semiconductor layer 200 is monitored. This step can dictate the planarity of the light-receiving surface of the photoelectric conversion unit 220 and the film-thickness uniformity of the semiconductor layer 200.

Subsequently, as in the second embodiment, on the front surface of the semiconductor layer 200 of the wafer 82 for the semiconductor part 002, the dielectric layer 511, the dielectric layer 512, and the dielectric layer 513 are formed. In the dielectric layer 513, a light-shielding film formed of a film of a metal such as tungsten and used for forming an OB region, or a light-shielding wall for isolation among light from the pixels and prevention of color mixture of the light may be formed (not shown). Incidentally, on the semiconductor layer 200, a color filter 514 and microlenses 515 may be formed. In the semiconductor layer 200, an opening (pad opening) may be formed so as to reach a pad electrode included in the wiring structure 010 or the wiring structure 020. In the semiconductor layer 100, a through-via (TSV) extending through the semiconductor layer 100 may be formed so as to be connected to an electrode included in the wiring structure 010 or the wiring structure 020.

Fourth Embodiment

Hereinafter, referring to FIG. 8A to FIG. 8D, a method for producing the semiconductor apparatus 930 according to a fourth embodiment will be described. The differences of this embodiment from the other embodiments are that the second to fourth thinning steps in FIG. 7B to FIG. 7D are performed by chemical mechanical polishing. A P++ type impurity region 701 in FIG. 8A has boron concentrations whose maximum value is more than $1\times10^{20}$ [atoms/cm$^3$]. The P++ type impurity region 701 has boron concentrations whose maximum value is, for example, $2\times10^{20}$ [atoms/cm$^3$] or more. The P+ type impurity region 701 is formed with a thickness of about 1 to about 3 μm.

Figure 8A:
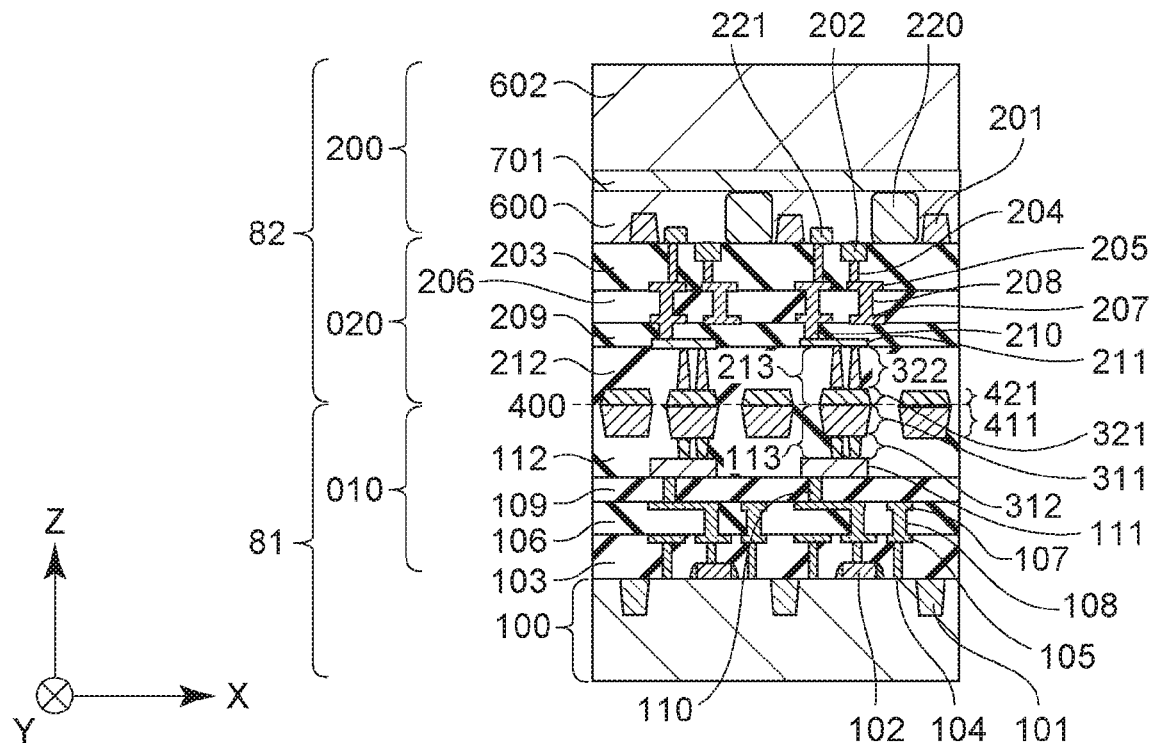
FIGS. 8A to 8D are schematic views of a method for producing a semiconductor apparatus.
Figure 8B:
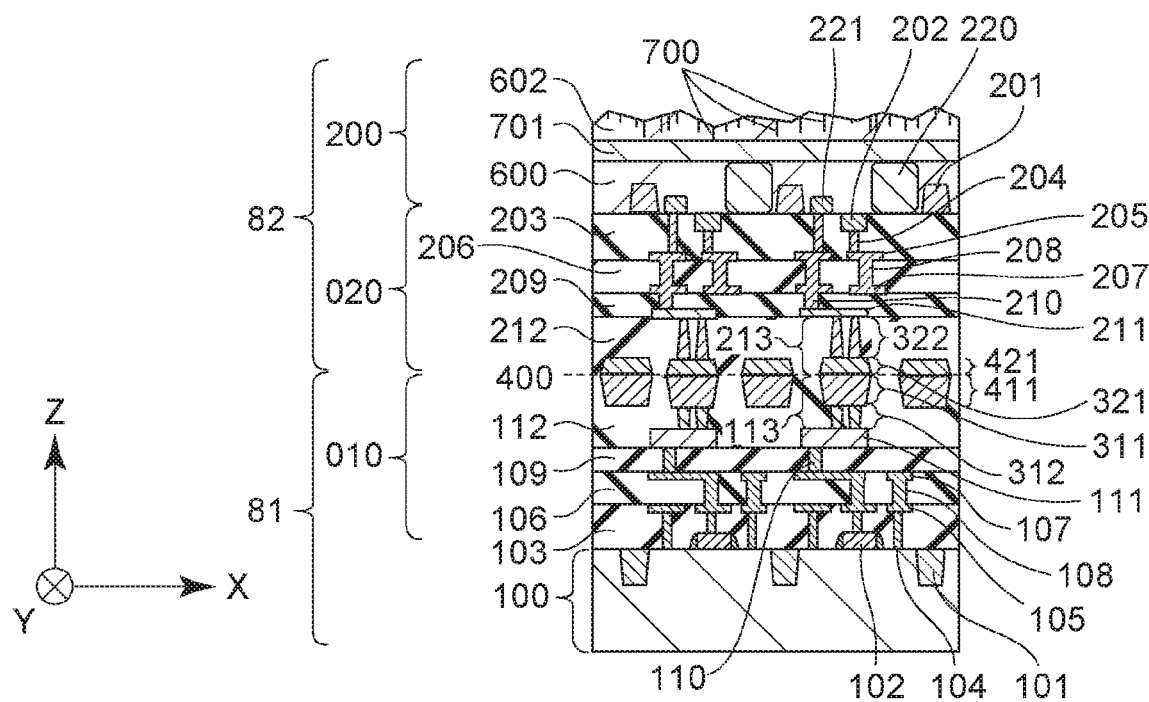

Subsequently, as illustrated in FIG. 8B, a first thinning step of performing mechanical grinding to thin the P type or N type impurity region 602 of the semiconductor layer 200 so as to have a thickness of about 1 to about 3 μm is performed.

Figure 8C:
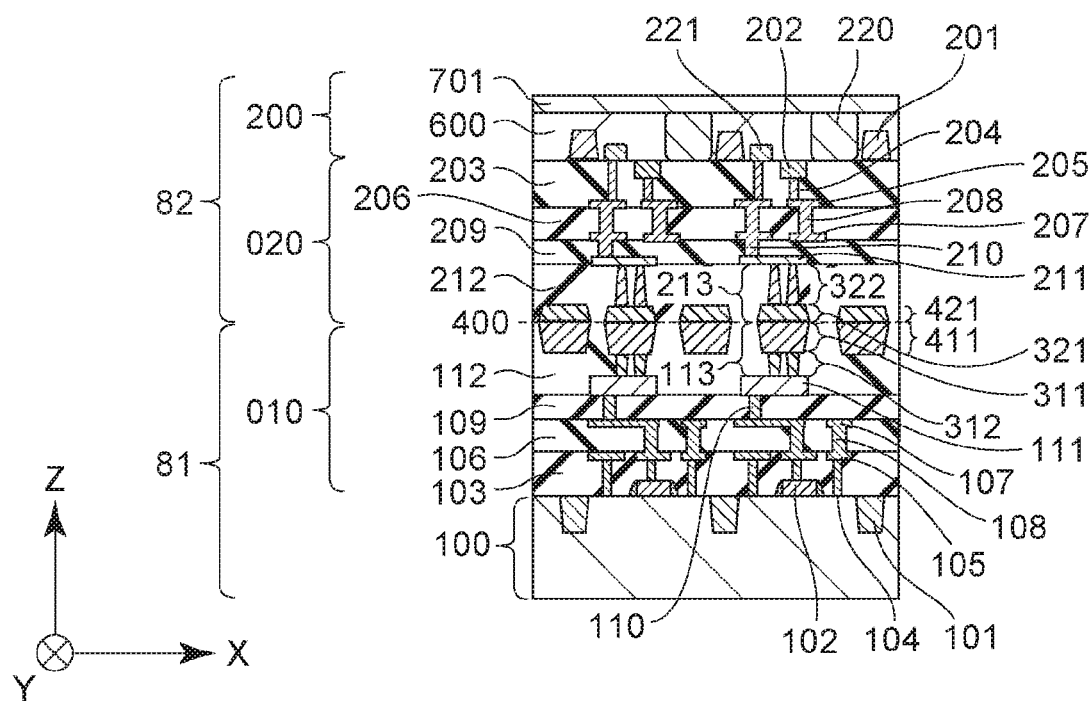

Subsequently, as illustrated in FIG. 8C, a second thinning step of performing chemical mechanical polishing to remove the remaining impurity region 602 until the P++ type impurity region 701 is exposed is performed. The second thinning step is performed such that, in the resultant semiconductor layer 200, a region extending 100 nm from the back surface 22 (on a side opposite from the front surface 21) has boron concentrations whose maximum value is more than $1\times10^{20}$ [atoms/cm$^3$]. The step of thinning the semiconductor layer 200 can be performed so as to expose a portion having boron concentrations of more than $2\times10^{20}$ [atoms/cm$^3$] by chemical mechanical polishing.

Figure 8D:
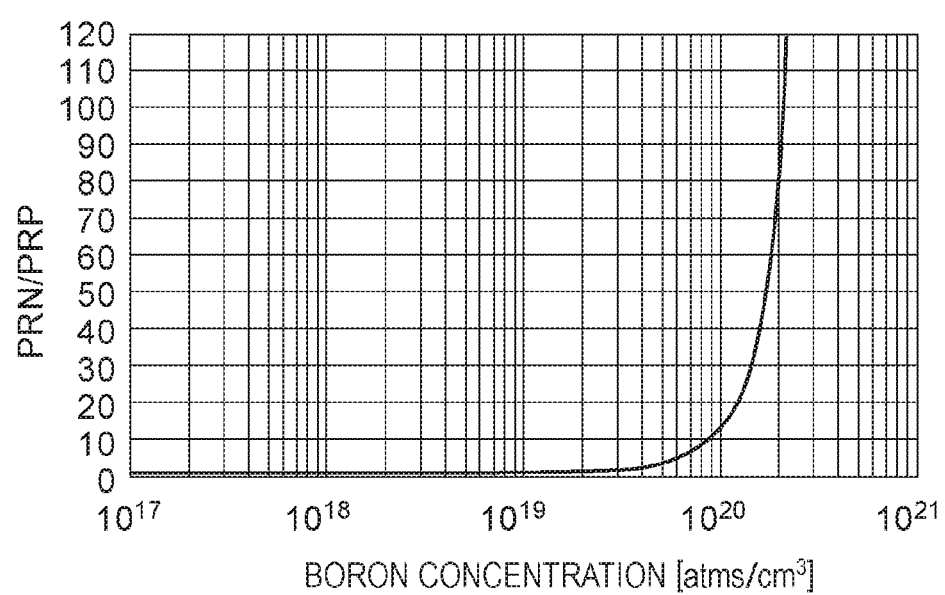

When the chemical mechanical polishing is performed for a region having a high P type impurity concentration, the polishing rate decreases because OH groups included in the slurry repel the high-concentration P type impurity (boron). In FIG. 8D, the abscissa axis indicates the boron concentration of a P type semiconductor region, and the ordinate axis indicates a ratio PRN/PRP of a polishing rate PRN for an N− type impurity region to a polishing rate PRP for the P type semiconductor region having a predetermined boron concentration. Incidentally, when the N− type impurity region has an N type impurity (phosphorus, arsenic) concentration of, for example, $6\times10^{14}$ [atoms/cm$^3$] or less, the PRN/PRP ratio substantially remains the same. Alternatively, instead of the N− type impurity region, when the P− type impurity (boron) concentration is, for example, $2\times10^{15}$ [atoms/cm$^3$] or less, the PRN/PRP ratio substantially remains the same.

As illustrated in FIG. 8D, the ratio PRN/PRP of the polishing rate PRN for the N− type impurity region to the polishing rate PRP for the P type impurity region sharply increases from about $1\times10^{20}$ [atoms/cm$^3$] with an increase in the impurity concentration of the P type impurity region. For example, when the P type impurity region has an impurity concentration of $2\times10^{20}$ [atoms/cm$^3$] or more, the polishing rate ratio PRN/PRP becomes 100 or more. Stated another way, the ratio PRP/PRN of the polishing rate PRP for the P type impurity region to the polishing rate PRN for the N− type impurity region sharply decreases from about $1\times10^{20}$ [atoms/cm$^3$] with an increase in the impurity concentration of the P type impurity region. For example, when the P type impurity region has an impurity concentration of $2\times10^{20}$ [atoms/cm$^3$] or more, the ratio PRP/PRN of the polishing rate for the P type impurity region to the polishing rate for the N− type impurity region becomes 1/100 or less.

Thus, during the thinning step for the impurity region 602 of the semiconductor layer 200, the P++ type impurity region 701 serves as the stopper against the chemical mechanical polishing, to thereby accurately control the thickness of the semiconductor layer 200. Therefore, the planarity of the semiconductor layer 200 can be improved.

An impurity region in which the ratio PRX/PRP of the polishing rate PRX to the polishing rate PRP for the P type impurity region sharply changes from an impurity concentration of about $1\times10^{20}$ [atoms/cm$^3$] of the P type impurity region will be described. As the impurity region polished at the polishing rate PRX, the N− type impurity region (PRX=PRN) is employed here as an example. However, as long as the impurity region in which PRX/PRP sharply changes from about $1\times10^{20}$ [atoms/cm$^3$] is an N type impurity region, similar results are obtained irrespective of the impurity concentration. Even when the impurity region is a P type impurity region, as long as it has a lower impurity concentration than in the P++ type impurity region 701, the result is similar to that of the N type impurity region. For this reason, during use of the P++ type impurity region 701 as the stopper against the chemical mechanical polishing, the impurity region 602 to be removed by the chemical mechanical polishing is at least an N type impurity region or a P type impurity region that has a lower impurity concentration than the impurity region 701.

The P+ type impurity region 701 exposed at the end of the second thinning step constitutes the back surface 22 of the semiconductor layer 200. This impurity region 701 can be used as the impurity region 229 described with reference to FIG. 1B, and has boron concentrations whose maximum value is more than $1\times10^{20}$ [atoms/cm$^3$], preferably boron concentrations whose maximum value is $2\times10^{20}$ [atoms/cm$^3$] or more. This high-concentration P+ type impurity region 701 functions as a barrier that prevents exposure of the end of the N type semiconductor region of the photoelectric conversion unit 220, from the back surface 22 of the semiconductor layer 200 (on the upper side in FIG. 8C), to thereby achieve a reduction in the dark current.

The above-described second to fourth embodiments share the following feature: after the thinning of the last thinning step, the semiconductor layer 200 is substantially not thinned any more. The last thinning step forms the back surface 22. As described above, the last thinning step may be performed by chemical mechanical polishing. The feature of substantially not thinning the semiconductor layer 200 any more encompasses, in addition to no thinning of the semiconductor layer 200 at all, slight thinning of the semiconductor layer 200 due to washing of the back surface of the semiconductor layer 200 or removal of the natural oxide film that can be formed on the back surface 22 of the semiconductor layer 200. Even when the semiconductor layer 200 is slightly thinned, the amount of the semiconductor layer 200 removed is less than 10 nm. After the thinning step, on the back surface 22, a dielectric film 500 is formed in contact with the back surface 22. Thus, after the chemical mechanical polishing of the last thinning step, the thickness of the semiconductor layer is not reduced by 10 nm or more, and the dielectric film 500 is formed in contact with the back surface 22. In the formation of the dielectric film 500, a metal oxide layer (dielectric layer 511) can be formed in a region extending 10 nm from the back surface 22. In the formation of the dielectric film 500, a metal oxide layer (dielectric layer 512) can be formed in a region extending 100 nm from the back surface 22.

Fifth Embodiment

Hereinafter, a method for producing the semiconductor apparatus 930 according to a fifth embodiment will be described. In this embodiment, the method for producing the wafer 81 for the semiconductor part 001 is similar to that of the second embodiment, and hence will not be described. The method for producing the wafer 82 for the semiconductor part 002, which is different from that of the second embodiment, will be described, and then the method for producing the semiconductor apparatus 930 using these two wafers 81 and 82 will be described.

Figure 9A:
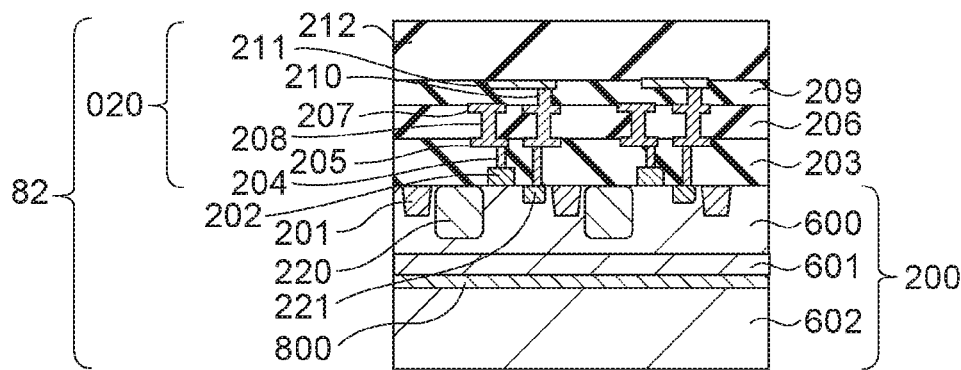
FIGS. 9A to 9D are schematic views of a method for producing a semiconductor apparatus.

First, referring to FIGS. 9A to 9D, the method for producing the wafer 82 for the semiconductor part 002 will be described. Referring to FIG. 9A, which illustrates a portion of the wafer 82 for the semiconductor part 002, the wafer 82 is prepared. The wafer 82 includes a semiconductor layer 200, an element isolation section 201, a gate electrode 202, an interlayer insulating film 203, and a contact plug 204. The semiconductor layer 200 can be referred to as a "substrate" or a "semiconductor layer". The semiconductor layer 200 has a bilayer epi structure, specifically has a structure in which, on a P type or N type impurity region 602, a P+ type impurity region 601 and a P− type or N− type impurity region 600 are formed in this order by epitaxial growth. Thus, the semiconductor layer 200 includes the P type or N type impurity region 602, the P type or N type (such as a P− type or N− type) impurity region 600, and the P type (such as a P+ type) impurity region 601 disposed between the impurity region 602 and the impurity region 600. The P+ type impurity region 601 has a concentration of a P type impurity such as boron (B) of $1\times10^{19}$ [atoms/cm$^3$] or more. The bilayer epi structure can be formed such that the P+ type impurity region 601 has a thickness of 5 to 10 µm, and the P− type or N− type impurity region 600 has a thickness of 5 to 10 µm. The larger the volume of the photoelectric conversion unit 220, the larger the amount of light subjected to photoelectric conversion; thus, compared with the thickness of the P+ type impurity region 601, the thickness of the P− type or N− type impurity region 600 can be made large.

Metal impurities generated during the steps of producing the wafer 82 for the semiconductor part 002 can cause white flaws more severely. In order to address this, the P type or N type impurity region 602 is formed so as to include a carbon-containing portion 800, which is a portion containing carbon for efficiently trapping metal impurities (gettering). The carbon-containing portion 800 is in the P type or N type impurity region 602, and is positioned at the front surface of the P type or N type impurity region 602. The carbon-containing portion 800 can be formed so as to have a thickness of 0.1 to 0.2 µm. In order to enhance the gettering effect, the carbon-containing portion 800 can be formed so as to have carbon concentrations whose maximum value is more than $1\times10^{19}$ [atoms/cm$^3$] and less than $1\times10^{20}$ [atoms/cm$^3$]. The carbon-containing portion 800 may contain oxygen. The oxygen contained in the carbon-containing portion 800 can be oxygen subjected to gettering by carbon contained in the carbon-containing portion 800. The maximum value of the oxygen concentrations of the carbon-containing portion 800 can be 1 to 10% (that is, 1/100 to 1/10) of the maximum value of the carbon concentrations of the carbon-containing portion 800.

In photoelectric conversion apparatuses (image pickup apparatuses), occurrence of image lag results in degradation of the image quality. One of the causes of image lag is oxygen present in the P− type or N− type impurity region 600. The lower the oxygen concentration of the P− type or N− type impurity region 600, the less the image lag. In order to lower the remaining oxygen concentration of the P− type or N− type impurity region 600, the remaining oxygen concentration of the P type or N type impurity region 602 needs to be lowered. On the other hand, in order to ensure the mechanical strength (mechanical strength for addressing wafer cracking and chipping due to thinning processing) of the P type or N type impurity region 602, oxygen needs to be contained to some extent. The P− type or N− type impurity region 600 can have an oxygen concentration of more than $2\times10^{16}$ [atoms/cm$^3$] and less than $3\times10^{17}$ [atoms/cm$^3$]. The P type or N type impurity region 602 can have an oxygen concentration of more than $3\times10^{17}$ [atoms/cm$^3$] and less than $7\times10^{17}$ [atoms/cm$^3$].

Figure 9B:
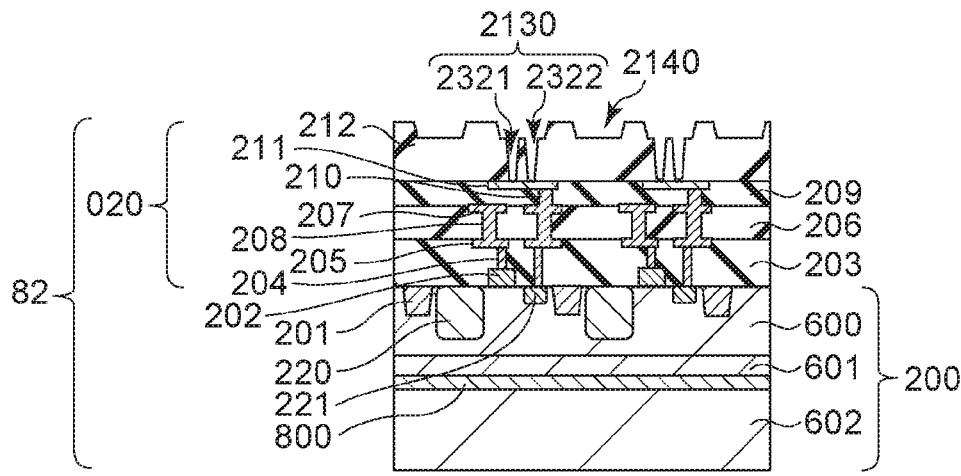
Figure 9C:
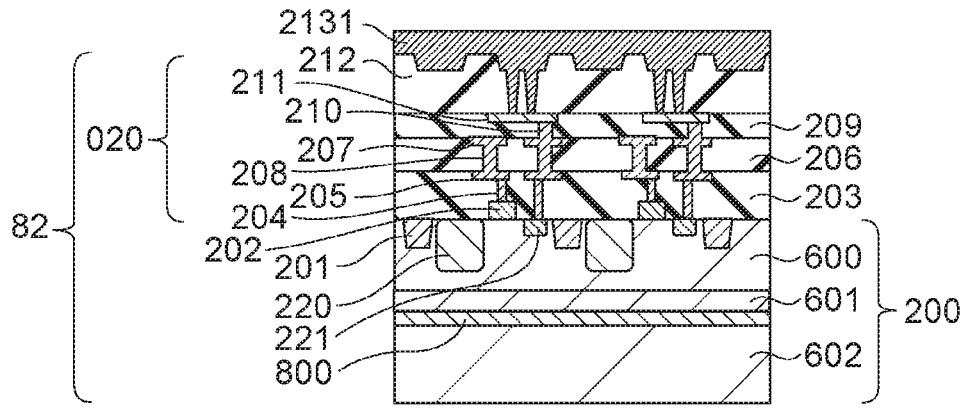
Figure 9D:
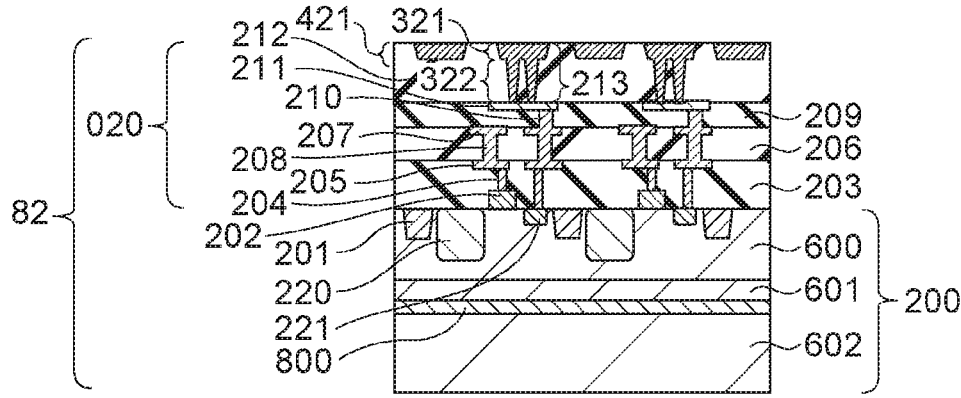

Subsequently, steps illustrated in FIG. 9B to FIG. 9D are performed to complete the wafer 82 for the semiconductor part 002. These steps are similar to those in FIG. 3B to FIG. 3D, and hence will not be described.

Figure 10A:
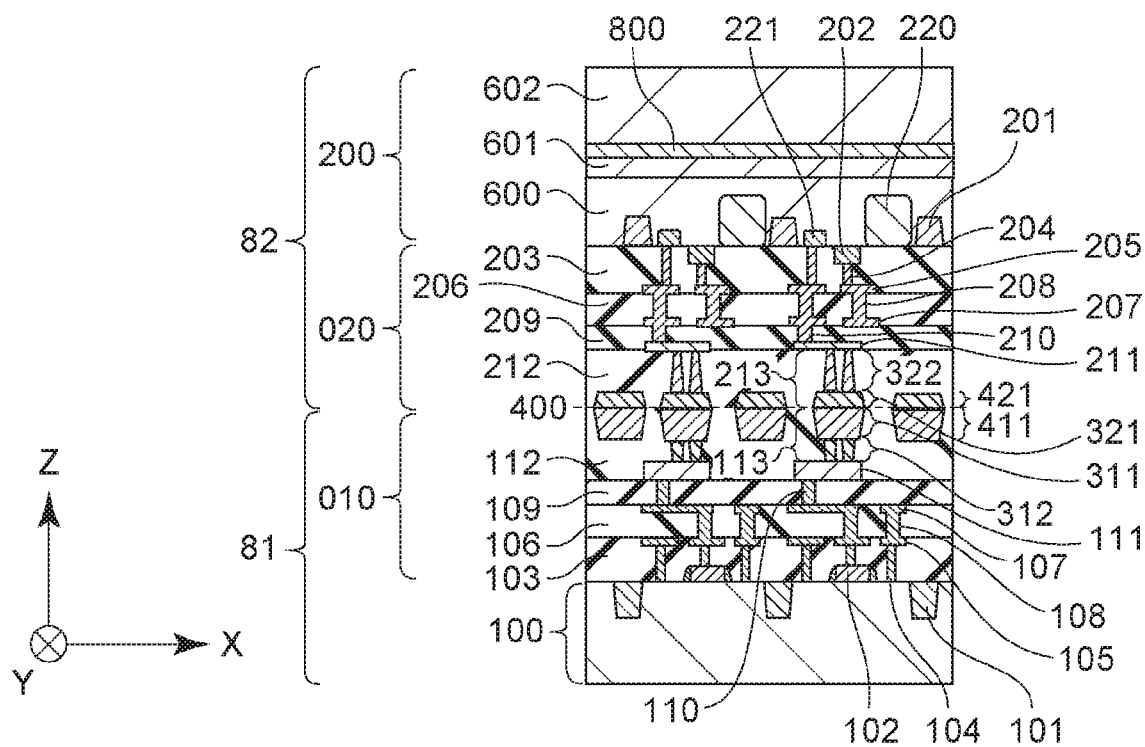
FIGS. 10A to 10D are schematic views of a method for producing a semiconductor apparatus.

Subsequently, referring to FIG. 10A to FIG. 10D, the method for producing the semiconductor apparatus 930 will be described. As illustrated in FIG. 10A, the wafer 82 for the semiconductor part 002 is inverted, and the wafer 81 for the semiconductor part 001 and the wafer 82 for the semiconductor part 002 are bonded together at a bonding interface 400. This bonding provides a structure in which, on the wafer 81 for the semiconductor part 001, the wafer 82 for the semiconductor part 002 is disposed. For example, the wafers are bonded together in the following manner. First, plasma activation is performed to activate the insulating films 112 and 212 of the wafers serving as bonding surfaces, and the activated insulating films 112 and 212 are bonded together to thereby temporarily bond the semiconductor wafers together. Subsequently, for example, a heat treatment is performed, to thereby bond together the insulating film 112 and the insulating film 212 at the bonding interface 400 more firmly than in the temporary bonding. In this way, the semiconductor layer 200 is prepared, the semiconductor layer 200 including a front surface at which a transistor is disposed, an opposite surface on a side opposite from the front surface, and a photoelectric conversion unit 220 disposed between the front surface and the opposite surface.

Figure 10B:
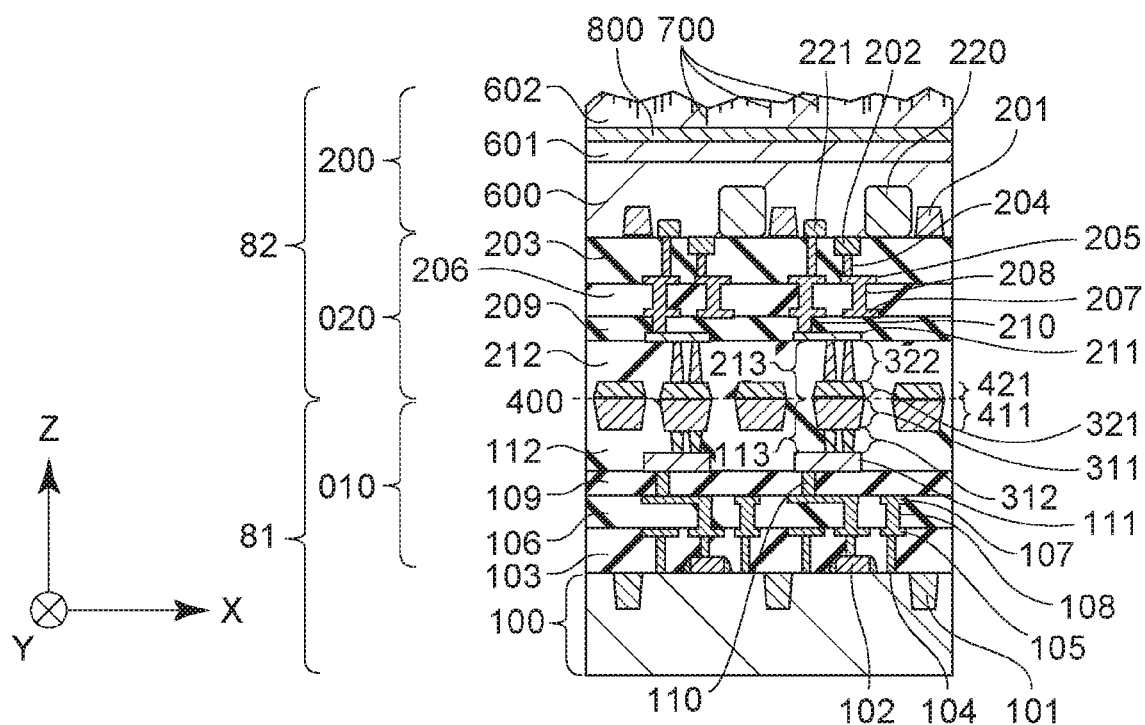

Subsequently, as illustrated in FIG. 10B, a first thinning step of thinning the P type or N type impurity region 602 of the semiconductor layer 200 is performed. The first thinning step has a fast processing speed, which enables an increase in the throughput of the production steps. The first thinning step can be performed by mechanical grinding; alternatively, the first thinning step may be performed by a thinning process other than wet etching, for example, a thinning process such as chemical mechanical polishing or dry etching. In the first thinning step, the carbon-containing portion 800 is left. This is because the cracked layer 700 is left in the P type or N type impurity region 602 having relatively high oxygen concentrations and high mechanical strength, to thereby suppress wafer cracking and chipping due to the fast processing speed in the first thinning step.

Figure 10C:
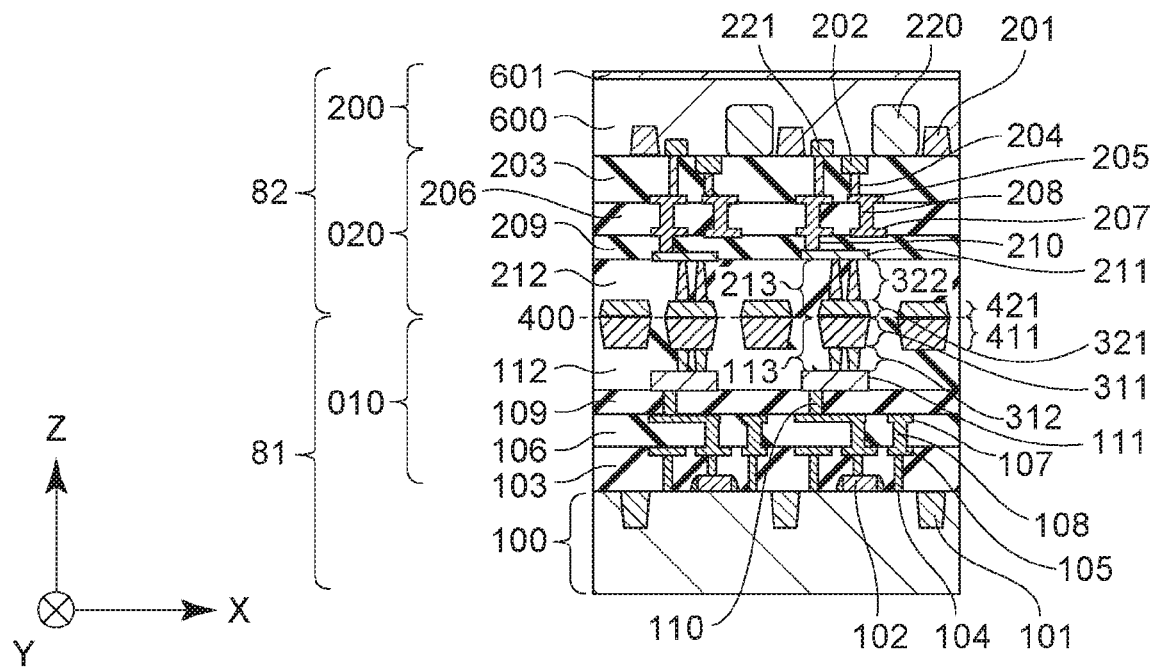

Subsequently, as illustrated in FIG. 10C, a second thinning step of performing a first wet etching to thin, in the semiconductor layer 200, the whole P type or N type impurity region 602, the carbon-containing portion 800, and the P+ type impurity region 601 is performed. The carbon-containing portion 800 is removed by wet etching, so that the metal impurities trapped at the carbon-containing portion 800 are dissolved in the first etchant during the second thinning step. Thus, re-adhesion, to the substrate, of the metal impurities trapped at the carbon-containing portion 800 can be suppressed, to thereby reduce white flaws in the photoelectric conversion apparatus (image pickup apparatus). As the first etchant, for example, a mixed reagent liquid of hydrofluoric acid (HF) and nitric acid ($HNO_3$) is employed. As the treatment conditions of the first wet etching, for example, the following treatment conditions can be employed.

Figure 10D:
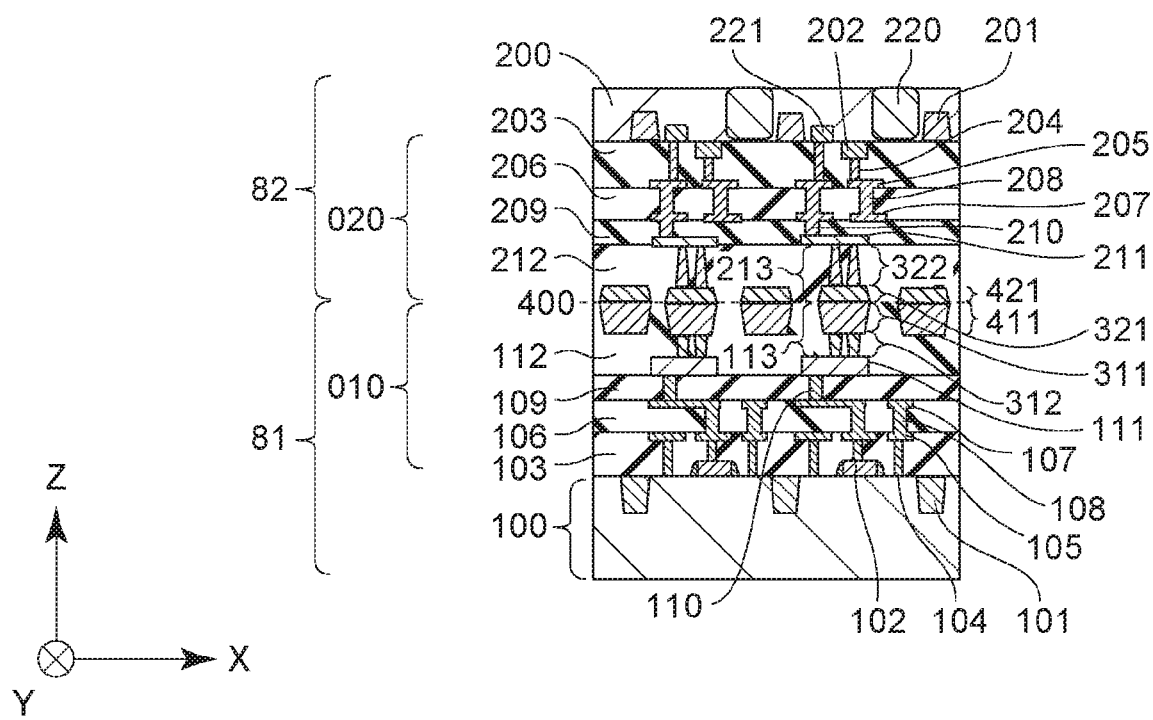

Reagent liquid temperature: 20 to 30° C.
Reagent liquid mixing ratio (HF:$HNO_3$)=1:10 to 1:100
Treatment time: 100 to 300 seconds Subsequently, as illustrated in FIG. 10D, a third thinning step of performing a second wet etching to selectively etch only the P+ type impurity region 601 of the semiconductor layer 200 is performed. Furthermore, as illustrated in FIG. 10D, a fourth thinning step of thinning the semiconductor layer 200 by chemical mechanical polishing is performed. This may be performed as in one of other embodiments (such as the third embodiment).

Subsequently, as in the third embodiment, on the front surface of the semiconductor layer 200 of the wafer 82 for the semiconductor part 002, the dielectric layer 511, the dielectric layer 512, and the dielectric layer 513 are formed. In the dielectric layer 513, for example, a light-shielding film formed of a film of a metal such as tungsten and used for forming an OB region, and a light-shielding wall for isolation among light from the pixels and prevention of color mixture of the light may be formed (not shown). Incidentally, on the semiconductor layer 200, a color filter 514 and microlenses 515 may be formed. In the semiconductor layer 200, an opening (pad opening) may be formed so as to reach a pad electrode included in the wiring structure 010 or the wiring structure 020. In the semiconductor layer 100, a through-via (TSV) extending through the semiconductor layer 100 may be formed so as to be connected to an electrode included in the wiring structure 010 or the wiring structure 020. Incidentally, in the fifth embodiment, the first thinning step may be omitted. Specifically, the thinning step firstly performed among the series of thinning steps may be the second thinning step performing wet etching. In the fifth embodiment, at least one of the third thinning step and the fourth thinning step may be omitted. Specifically, the thinning step lastly performed among the series of thinning steps may be any one of the second thinning step, the third thinning step, and the fourth thinning step.

Sixth Embodiment

Figure 11:
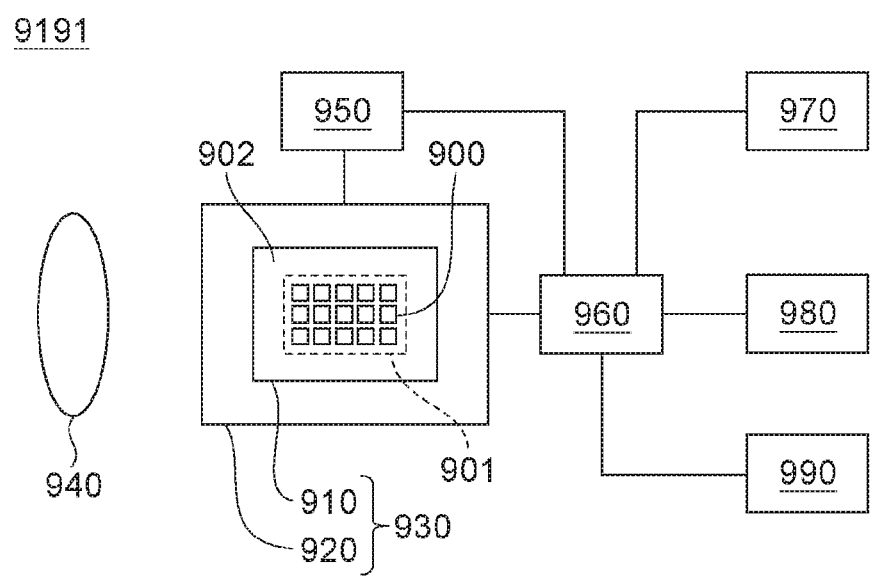
FIG. 11 is a schematic view of a semiconductor apparatus and a system.

Referring to FIG. 11, a semiconductor apparatus 930 according to a sixth embodiment will be described. FIG. 11 is a schematic view of a system 9191 including the semiconductor apparatus 930. The semiconductor apparatus 930 may include a semiconductor device 910 including the above-described semiconductor part 001 and semiconductor part 002, and a package 920 containing the semiconductor device 910; alternatively, the semiconductor apparatus 930 may not include the package 920. The semiconductor layer 100 and the semiconductor layer 200 are included in the semiconductor device 910. In this embodiment, the semiconductor apparatus 930 is a photoelectric conversion apparatus (image pickup apparatus). The semiconductor device 910 includes a pixel region 901 in which pixel circuits 900 are arranged in matrix and a peripheral region 902 surrounding the pixel region 901. In the peripheral region 902, a peripheral circuit and input/output terminals can be disposed. The semiconductor apparatus 930 is included in the system 9191. The system 9191 can include at least one of an optical device 940, a control device 950, a processing device 960, a display device 970, a storage device 980, and a mechanical device 990.

Hereinafter, referring to FIG. 11, the system 9191 including the semiconductor apparatus 930 will be described in detail. As described above, the semiconductor apparatus 930 can include, in addition to the semiconductor device 910 including the semiconductor layer 100, the package 920 containing the semiconductor device 910. The package 920 can include a base member on which the semiconductor device 910 is fixed, and a lid member disposed so as to face the semiconductor device 910 and formed of, for example, glass. The package 920 can further include a bonding member connecting a terminal disposed on the base member and a terminal disposed on the semiconductor device 910 to each other, such as a bonding wire or a bump.

The system 9191 can include at least any one of the optical device 940, the control device 950, the processing device 960, the display device 970, the storage device 980, and the mechanical device 990. The optical device 940 corresponds to the semiconductor apparatus 930. The optical device 940 is, for example, a lens, a shutter, or a mirror. The control device 950 controls the semiconductor apparatus 930. The control device 950 is, for example, a semiconductor device such as an ASIC.

The processing device 960 processes signals outputted from the semiconductor apparatus 930. The processing device 960 is a semiconductor device that constitutes an AFE (analog front end) or a DFE (digital front end), such as a CPU or an ASIC. The display device 970 is an EL display device or liquid-crystal display device that displays data (image) obtained using the semiconductor apparatus 930. The storage device 980 is a magnetic device or semiconductor device that stores data (image) obtained using the semiconductor apparatus 930. The storage device 980 is a volatile memory such as an SRAM or a DRAM, or a nonvolatile memory such as a flash memory or a hard disk drive.

The mechanical device 990 includes a movable section or a driving section such as a motor or an engine. In the system 9191, signals outputted from the semiconductor apparatus 930 are displayed on the display device 970, or transmitted, to the outside, using a communication device (not shown) of the system 9191. Thus, the system 9191 can further include, in addition to the storage circuit and the arithmetic operation circuit of the semiconductor apparatus 930, the storage device 980 and the processing device 960. The mechanical device 990 may be controlled in accordance with signals outputted from the semiconductor apparatus 930.

The system 9191 is suitable for electronic systems such as information terminals having an image pickup function (such as smartphones and wearable terminals) and cameras (such as interchangeable-lens cameras, compact cameras, video cameras, and security cameras). The mechanical device 990 in such a camera may be configured to drive parts of the optical device 940 for zooming, focusing, and shutter operations. The mechanical device 990 of the camera may be configured to move the semiconductor apparatus 930 for vibration control operations.

The system 9191 may be a transport system such as a vehicle, a ship, or aircraft. The mechanical device 990 in such a transport system can be used as a moving device. The system 9191 serving as a transport system is suitable for transport systems that transport the semiconductor apparatus 930, and transport systems that use an image pickup function for assisting in and/or automation of driving (control). The processing device 960 for assisting in and/or automation of driving (control) is configured to perform processing for operating the mechanical device 990 serving as a moving device, in accordance with data obtained using the semiconductor apparatus 930. The system 9191 is also applicable to medical systems such as endoscopes, measurement systems such as distance measuring sensors, analytical systems such as electron microscopes, and office machines such as copiers.

Embodiments according to the present disclosure provide techniques that effectively improve properties of semiconductor apparatuses. The above-described embodiments can be appropriately changed without departing from the technical idea. Incidentally, the disclosure encompasses, in addition to the descriptions, all the features understood from this disclosure and the drawings attached hereto. The disclosure encompasses the complementary sets of the concepts described herein. Specifically, for example, when the disclosure includes a description "A is B", even when a description "A is not B" is omitted, the disclosure is regarded as disclosing "A is not B". This is because the description "A is B" is provided after the case of "A is not B" is studied. The invention is not limited to the above-described embodiments, and the embodiments can be changed or modified in various ways without departing from the spirit and scope of the invention. Thus, in order to make the scope of the invention public, claims are attached.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-194803, filed Oct. 25, 2019, and Japanese Patent Application No. 2020-132817 filed Aug. 5, 2020, which are hereby incorporated by reference herein in their entirety.

What is claimed is:

1. A semiconductor apparatus comprising:
a semiconductor layer that includes a front surface, a back surface, a photoelectric conversion unit disposed between the front surface and the back surface, and a transistor disposed at the front surface, and that is mainly formed of silicon; and
a dielectric film in contact with the back surface,
wherein the semiconductor layer includes a region extending 100 nm from the back surface, the region having boron concentrations whose maximum value is more than $1 \times 10^{20}$ [atoms/cm$^3$].

2. The semiconductor apparatus according to claim 1, wherein the dielectric film includes a metal oxide layer in a region extending 100 nm from the back surface.

3. The semiconductor apparatus according to claim 2, wherein the semiconductor layer includes a first photoelectric conversion unit and a second photoelectric conversion unit, and, in the semiconductor layer, a trench is formed between the first photoelectric conversion unit and the second photoelectric conversion unit.

4. The semiconductor apparatus according to claim 1, wherein a maximum value of boron concentrations of a region extending 100 nm from the front surface is lower than the maximum value of the boron concentrations of the region extending 100 nm from the back surface and/or a boron concentration at a position of 50 nm from the back surface is more than $1 \times 10^{18}$ [atoms/cm$^3$].

5. The semiconductor apparatus according to claim 1, wherein the maximum value is more than $2 \times 10^{20}$ [atoms/cm$^3$] and/or the maximum value is less than $5 \times 10^{22}$ [atoms/cm$^3$].

6. The semiconductor apparatus according to claim 3, wherein the maximum value is more than $5 \times 10^{20}$ [atoms/cm$^3$] and/or less than $1 \times 10^{22}$ [atoms/cm$^3$].

7. A method for producing a semiconductor apparatus, the method comprising:
a step of preparing a semiconductor layer that includes a front surface at which a transistor is disposed, an opposite surface on a side opposite from the front surface, and a photoelectric conversion unit disposed between the front surface and the opposite surface, and that is mainly formed of silicon; and
a step of thinning the semiconductor layer from a side of the opposite surface,
wherein the semiconductor layer includes an impurity region disposed between the front surface and the opposite surface and having boron concentrations whose maximum value is more than $1 \times 10^{20}$ [atoms/cm$^3$], and
the step of thinning the semiconductor layer is performed such that, after the thinning, a region of the semiconductor layer, the region extending 100 nm from the opposite surface on the side opposite from the front surface, has boron concentrations whose maximum value is more than $1 \times 10^{20}$ [atoms/cm$^3$].

* * * * *